(12) United States Patent
Tanaka et al.

(10) Patent No.: US 6,320,778 B1
(45) Date of Patent: Nov. 20, 2001

(54) SEMICONDUCTOR MEMORY WITH BUILT-IN CACHE

(75) Inventors: Yasuhiro Tanaka; Tetsuya Tanabe; Satoru Tanoi, all of Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/788,262

(22) Filed: Feb. 16, 2001

Related U.S. Application Data

(62) Division of application No. 09/458,894, filed on Dec. 10, 1999, now Pat. No. 6,249,450, which is a division of application No. 09/003,736, filed on Jan. 17, 1998, now Pat. No. 6,011,709, which is a division of application No. 08/365,970, filed on Dec. 29, 1994, now Pat. No. 5,596,521.

(30) Foreign Application Priority Data

| Jan. 6, 1994 | (JP) | 6-000210 |
| Jan. 11, 1994 | (JP) | 6-001298 |

(51) Int. Cl.[7] .................................................. G11C 15/00
(52) U.S. Cl. ................................ 365/49; 365/230.09
(58) Field of Search ............................... 365/49, 230.09, 365/203, 149, 210, 194

(56) References Cited

U.S. PATENT DOCUMENTS

| 4,943,944 | 7/1990 | Sakui et al. | 395/449 |
| 4,945,512 | 7/1990 | DeKarske et al. | 365/49 |
| 5,184,320 | 2/1993 | Dye | 365/49 |
| 5,226,009 | 7/1993 | Arimoto | 365/49 |
| 5,226,147 | 7/1993 | Fujishima | 365/49 |
| 5,249,282 | 9/1993 | Segers | 365/49 |

FOREIGN PATENT DOCUMENTS

| 499 256 A1 | 8/1992 | (EP) . |
| 552 667 A1 | 7/1993 | (EP) . |

OTHER PUBLICATIONS

IEEE International Solid State Circuits Conference, vol. 35, Feb. 1, 1992, pp. 148–149, 269.

*Primary Examiner*—A. Zarabian

(57) ABSTRACT

A semiconductor memory device has memory cells for storing data, sense amplifiers for amplifying the stored data, and cache cells in which the amplified data can be placed for quick recall. The cache cells can continue to hold data during memory-cell refresh cycles, permitting the cached data to be accessed quickly afterward. The cache cells may be coupled to column data lines that can be disconnected from the sense amplifiers, enabling memory cells to be refreshed while cache access is in progress. Write buffers may be provided so that when cache data are replaced, the old cache data can be copied back to the memory cells while the new cache data are being accessed.

4 Claims, 23 Drawing Sheets

SEMICONDUCTOR MEMORY WITH BUILT-IN CACHE

This is a division of application Ser. No. 09/458,894 filed Dec. 10, 1999 now U.S. Pat. No. 6,249,450, which is a Division of application Ser. No. 09/003,736 filed Jan. 17, 1998, now U.S. Pat. No. 6,011,709 issued Jan. 4, 2000, which is a Division of Application Ser. No. 08/365,970 filed Dec. 29, 1994, now U.S. Pat. No. 5,596,521 issued Jan. 21, 1997.

BACKGROUND OF THE INVENTION

This invention relates to a semiconductor memory device such as a dynamic random-access memory (DRAM), more particularly to a semiconductor memory device with a built-in cache in which data can be stored for quick recall.

A DRAM has, among other circuits, an array of memory cells identified by row and column addresses, and a row of sense amplifiers. In read or write access, a row address is input, the memory cells in the addressed row are coupled to the sense amplifiers, and their data are amplified. Next a column address is input, and in read access for example, the amplified data for the addressed column are output to a data bus. Further column addresses may then be input to access the data of other columns in the same row. When such access ends, in a conventional DRAM, the sense amplifiers are disabled, and the data remain held only in the memory cell array.

A problem in the conventional DRAM is that before each access cycle, the sense amplifiers, and the bit lines that couple them to the memory cells, must be precharged by equalizing them to a certain potential. Furthermore, at the beginning of every cycle, the sense amplifiers must amplify the data in an entire row of memory cells. Substantial time is required for these operations, particularly in a large-scale memory with long bit lines, which have large intrinsic capacitances that must be charged and discharged. This severely limits the access speed of the device.

One possible solution to this problem is to retain data in the sense amplifiers by leaving them enabled at the end of an access cycle, thereby using the sense amplifiers as a cache. Then if the same row address is input again, the addressed data are immediately available from the sense amplifiers and do not have to be read from the memory cells. This scheme is particularly suited to a device in which the memory cell array is divided into multiple banks, and multiple rows of sense amplifiers are provided, permitting data from different banks to be cached in different sense amplifier rows.

The utility of this method is restricted, however, by the need to refresh data in DRAM memory cells periodically. Each time a refresh is carried out, the data being held in the relevant sense amplifiers are lost. The data are also lost if the device is placed in standby and the sense amplifiers are powered down.

Another problem is that each row of sense amplifiers can hold data for only a single row of memory cells. If access alternates between two rows in the same bank, for example, the above method confers no benefit.

SUMMARY OF THE INVENTION

It is accordingly an object of the present invention to enable rapid access to data in a semiconductor memory device.

Another object of the invention is to avoid loss of rapidly accessible data when a refresh occurs.

Yet another object is to enable refresh cycles and access cycles to take place simultaneously.

Still another object is to reduce current dissipation when data are transferred from memory cells to sense amplifiers.

The invented semiconductor memory device has a row-column array of memory cells for storing data. Bit lines extending in the column direction transport data to and from memory cells selected by word lines extending in the row direction. The bit lines are coupled via a row of first switching elements to corresponding sense lines, to which sense amplifiers are coupled.

According to a first aspect of the invention, one or more rows of cache cells are coupled to the sense lines. According to a second aspect of the invention, column data lines are coupled via second switching elements to the sense lines, and one or more rows of cache cells are coupled to the column data lines.

In either aspect of the invention, each row of cache cells can store data from an arbitrary row of memory cells. Data transferred from the memory cells to the sense lines and amplified by the sense amplifiers can be placed in the cache cells for quick recall later. The cache cells can continue to store such data while the sense amplifiers are refreshing the memory cells.

If the cache cells are coupled to column data lines, then during refresh operations, the column data lines can be disconnected from the sense lines, and access to data on the column data lines can continue while the refresh is in progress.

A tag circuit is provided to keep track of the row addresses of the memory cells having data stored in the cache cells, and control transfers of data to and from the cache cells.

DETAILED DESCRIPTION OF THE INVENTION

Figure 1:
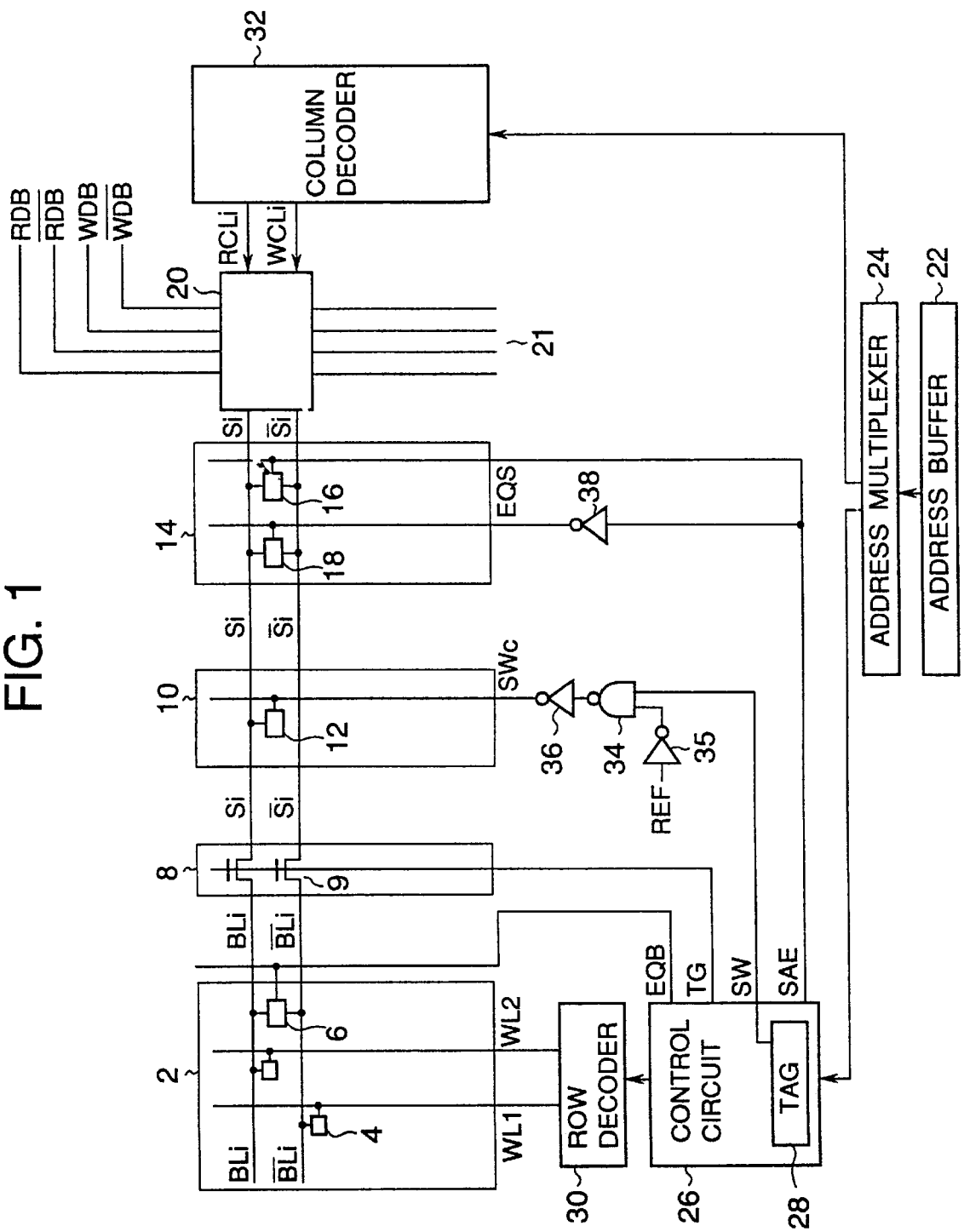
FIG. 1 is a block diagram of a novel DRAM with a cache.

Several embodiments of the invention will now be described with reference to the attached illustrative drawings. The drawings have been somewhat simplified, to avoid obscuring the invention with irrelevant detail. Control signal lines will be designated by the names of the control signals they carry. All control signals are shown as active high, and the high (active) level is denoted by Vcc. The low (inactive) level is denoted by Vss, or by the conventional ground symbol. Some signals may be boosted to an active level higher than Vcc, as will be explained later.

The terms row and column will be used frequently. In the drawings, rows are vertical and columns are horizontal. In the specification and claims, the term row will often be used to denote a plurality of identical objects aligned in the row direction. For example, a "row of cache cells" describes a row of possibly thousands of cache cells extending in the vertical direction in the drawings, even though only one cache cell in the row is actually shown.

FIG. 1 is a block diagram of a DRAM provided with a novel cache that shadows the data held in the sense amplifiers, so that these data need not be lost in a refresh or standby.

The DRAM comprises a memory cell array 2 having memory cells 4 coupled to word lines WL1, WL2, ... which run in the row direction. They are intersected by pairs of complementary bit lines BLi and $\overline{BLi}$ running in the column direction. Each memory cell 4 is coupled to one word line and one bit line. Each pair of complementary bit lines forms one column in the array, BLi and $\overline{BLi}$ being the bit lines of the i-th column. The bit lines transport data (electrical charges) to and from the memory cells. The word lines control the transfer of data between their coupled memory cells and the bit lines.

Each column has an equalizing circuit 6 coupled between its pair of complementary bit lines BLi and $\overline{BLi}$. These equalizing circuits are all controlled by a common signal line EQB.

The memory cell array 2 has word lines, bit lines, and memory cells other than the ones shown in FIG. 1, but they have been omitted to simplify the drawing.

The bit lines BLi and $\overline{BLi}$ are coupled through a transfer circuit 8 to corresponding pairs of complementary sense lines Si and $\overline{Si}$. The transfer circuit 8 comprises switching elements such as N-channel metal-oxide-semiconductor transistors (NMOS transistors) 9 controlled by a transfer gate signal TG. Each NMOS transistor 9 is coupled in series between one bit line and the corresponding sense line, and the gates of all these NMOS transistors 9 are coupled in common to the TG control signal line.

Coupled to the sense lines Si and $\overline{Si}$ are a cache 10 comprising a row of cache cells 12 for temporarily storing data having an arbitrary row address, a sense amplifier row 14 comprising a row of sense amplifiers 16 and a row of sense-line equalizing circuits 18, and a plurality of column switching circuits 20. As illustrated, there is one cache cell 12, sense amplifier 16, sense-line equalizing circuit 18, and column switching circuit 20 per column in the memory cell array 2. The column switching circuit 20 selectively couples the sense lines Si and $\overline{Si}$ to a data bus 21 comprising complementary read data lines RDB and $\overline{RDB}$ for output of read data, and complementary write data lines WDB and $\overline{WDB}$ for input of write data.

Each cache cell 12 is coupled to at least one of the two sense lines Si and $\overline{Si}$ in its column, and all the cache cells 12 are coupled to a common control line that carries a cache control signal SWc. Each sense amplifier 16 is coupled to both sense lines Si and $\overline{Si}$ in its column, and all the sense amplifiers 16 are coupled to a common control line that carries a sense amplifier enable signal SAE. Each equalizing circuit 18 is coupled to both sense lines Si and $\overline{Si}$ in its column, and all the equalizing circuits are coupled to a common control line EQS.

The cache 10, sense amplifier row 14, and column switching circuits 20 need not be coupled to the sense lines Si and $\overline{Si}$ in the order shown in FIG. 1. Another possible order will be illustrated in later embodiments. Furthermore, although the sense lines Si and $\overline{Si}$ are shown in the drawings as single lines, it is possible for the sense amplifiers 16 to have nodes which are coupled by separate signal lines to the transfer circuit 8, cache cells 12, and column switching circuit 20; the term "sense lines" then encompasses both these nodes and the separate signal lines connected to them.

An address buffer 22 is provided for input of row and column addresses. An address multiplexer 24 sends the row addresses to a control circuit 26. The control circuit 26 has a tag circuit 28 for storing the row address of the data currently held in the cache 10, and a flag indicating whether the cache contents are valid. When the cache contents are flagged as invalid, the cache is said to be empty.

The tag circuit 28 activates a control signal SW when a cache hit occurs, i.e. when the flag indicates that the cache contents are valid and the address stored in the tag circuit 28 matches the current input row address. Control signal SW is used in generating the SWc signal that controls the cache 10. The control circuit 26 also has registers (not shown) for holding the current and preceding row address inputs, and various logic and timing circuits that generate control signals EQB, TG, and SAE.

The control circuit 26 furnishes row addresses as appropriate to a row decoder 30, which activates drivers (not shown) to drive the corresponding word lines in the memory cell array 2. The address multiplexer 24 sends column addresses to a column decoder 32, which controls the column switching circuits 20. For the i-th column, the column decoder generates a read column signal RCLi and a write column signal WCLi.

The SW signal output by the control circuit 26 becomes one input of a two-input NAND gate 34. The other input to this NAND gate 34 is a REF signal that is activated during refresh cycles. The REF signal is generated by another control circuit, not shown in the drawing, and is inverted by an inverter 35 before input to the NAND gate 34. The output of the NAND gate 34 is inverted by another inverter 36 to generate the cache control signal SWc.

The SAE signal output by the control circuit 26 is inverted by an inverter 38 to generate the EQS signal that controls the equalizing circuits 18 in the sense amplifier row 14. Additional circuit elements (not shown) are used to provide timing delays between EQS and SAE.

Figure 2:
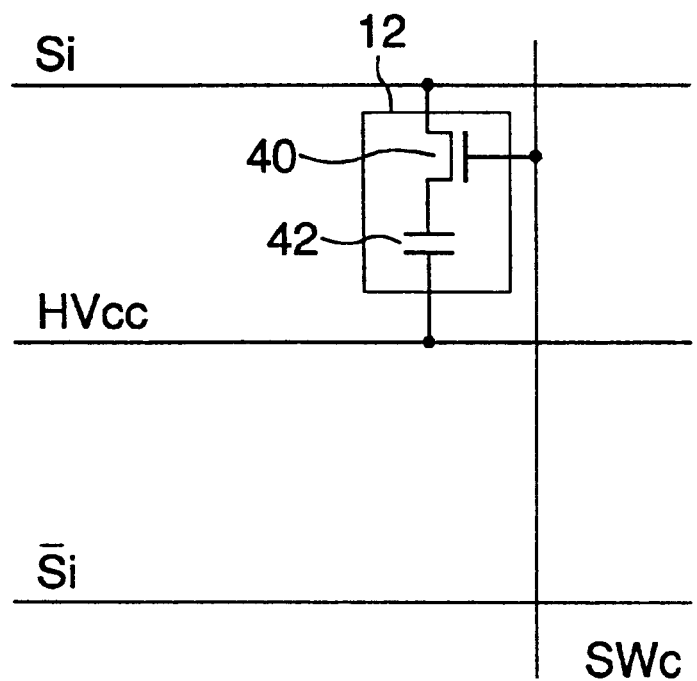
FIG. 2 is a circuit diagram of a cache cell.

FIG. 2 shows one preferred configuration of the cache cells 12. The cache cell 12 in this drawing comprises a single switching element such as an NMOS transistor 40, and a storage element such as a capacitor 42. The transistor 40 is coupled in series between a sense line Si and one electrode of the capacitor 42. The other electrode of the capacitor 42 is coupled to an HVcc line (not shown in FIG. 1) which is held at a fixed potential intermediate between the two fixed potential levels Vcc and Vss. (Typically, HVcc is halfway between Vcc and Vss.)

The cache cell configuration in FIG. 2 is similar to the configuration of the memory cells 4 in the memory cell array 2. In the present embodiment, however, the transistor 40 and capacitor 42 preferably have larger dimensions than the corresponding transistors and capacitors of the memory cells 4, so that the cache can be accessed quickly and does not require frequent refreshing.

Figure 3:
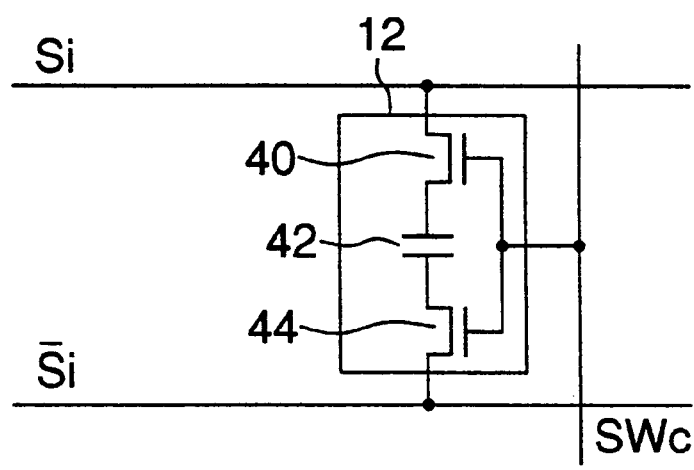
FIG. 3 is a circuit diagram of another cache cell.

FIG. 3 shows another preferred cache-cell configuration, having two NMOS transistors 40 and 44 coupled in series between complementary sense lines Si and $\overline{\text{Si}}$. The gates of both transistors 40 and 44 are driven by the cache control line SWc. The capacitor 42 is coupled in series between the two transistors 40 and 44. This cache cell takes up more space, but has the advantage of faster read-out than the cache cell in FIG. 2, because it creates a greater potential swing between the two sense lines Si and $\overline{\text{Si}}$.

Detailed descriptions of the other circuits in FIG. 1 will be omitted at this point, as these circuits will be familiar to those skilled in the semiconductor memory art, but the functions of their control signals will be briefly explained.

When EQB is active, the equalizing circuit 6 equalizes the bit lines BLi and $\overline{\text{BLi}}$ to the intermediate potential HVcc.

When TG is active, the transfer circuit 8 couples the bit lines BLi and $\overline{\text{BLi}}$ to the sense lines Si and $\overline{\text{Si}}$.

When SWc is active, the storage elements in the cache cells 12 are coupled to the sense lines Si and $\overline{\text{Si}}$, permitting data transfer. This occurs when SW is active and REF is inactive.

When SAE is inactive and EQS is active, the sense amplifiers are disabled, meaning that their Vcc and Vss power supplies (not shown) are switched off, and the sense lines Si and $\overline{\text{Si}}$ are equalized to HVcc. When SAE is active and EQS is inactive, the sense amplifiers 16 are enabled, meaning that they are supplied with Vcc and Vss, and if a potential difference exists on the sense lines Si and $\overline{\text{Si}}$, they amplify it by pulling the higher sense line up to Vcc and the lower sense line down to Vss.

When RCLi is active, the column switching circuit couples sense lines Si and $\overline{\text{Si}}$ to the read data lines RDB and $\overline{\text{RDB}}$. The coupling may be effected through a simple and well-known transistor amplifier circuit, which will be illustrated later. When WCLi is active, sense lines Si and $\overline{\text{Si}}$ are coupled to the write data lines WDB and $\overline{\text{WDB}}$.

Figure 4:
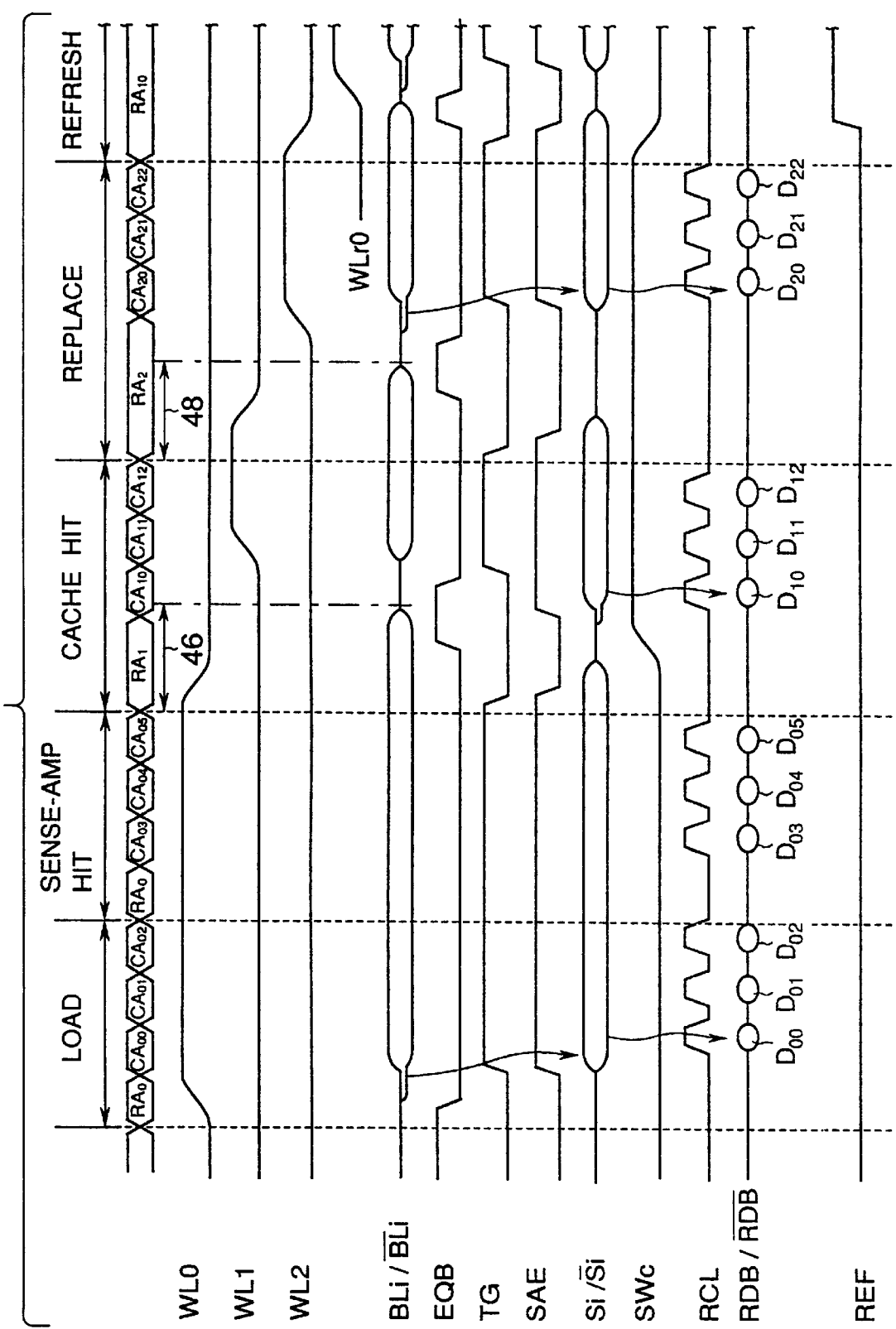
FIG. 4 is a timing diagram illustrating the operation of the DRAM in FIG. 1.

FIG. 4 is a timing diagram of the DRAM in FIG. 1, showing several types of memory access cycles. For simplicity, it will be assumed that all accesses are read accesses.

At the extreme left of FIG. 4, the DRAM is in the standby state: a state in which the sense amplifiers are disabled because no access is occurring. All word lines are inactive, control signals TG, SW, SWc, and SAE are inactive, and EQB and EQS are active. The bit lines BLi and $\overline{\text{BLi}}$ and sense lines Si and $\overline{\text{Si}}$ are equalized to the intermediate potential HVcc. The cache 10 is disconnected from the sense lines, but holds the data of, for example, row $RA_1$. The tag circuit 28 holds the matching row address $RA_1$.

The first cycle illustrated in FIG. 4 is a miss cycle in which new data are loaded into the sense amplifiers, while the cache 10 continues to hold the data of row $RA_1$.

When row address $RA_0$ is input, the control circuit 26 compares it with the address $RA_1$ stored in the tag circuit 28 and finds that the two do not match. Since no data are currently held in the sense amplifiers, the control circuit 26 outputs row address $RA_0$ to the address decoder 30, which drives the corresponding word line WL0 to the active state. The data (electrical charges) in the memory cells 4 in row $RA_1$ are thereby transferred onto the bit lines, causing a slight potential divergence on each pair of complementary bit lines BLi and $\overline{\text{BLi}}$, as shown in the drawing.

Next, the control circuit 26 activates control line TG, turning on the transistors 9 in the transfer circuit 8, and activates control line SAE, enabling the sense amplifiers 16. The pairs of bit lines BLi and $\overline{\text{BLi}}$ are accordingly coupled to the sense lines Si and $\overline{\text{Si}}$ and the potential differences on them are amplified. The data in one row of memory cells have now been read onto the sense lines Si and $\overline{\text{Si}}$ and amplified.

A series of column addresses $CA_{00}$, $CA_{01}$, and $CA_{02}$ is now input and decoded by the column decoder 32, causing it to generate three read column signals RCL. Although all three RCL signals are shown for convenience on a single line in FIG. 4, this represents three read column signals RCLi with possibly different values of "i," designating different columns. Each read column signal couples one pair of sense lines Si and $\overline{\text{Si}}$ to the read data lines RDB and $\overline{\text{RDB}}$ and transfers the corresponding data $D_{00}$, $D_{01}$, and $D_{02}$ onto these data lines.

Control line SW is left inactive throughout this load cycle, retaining the data of row $RA_1$ in the cache 10. At the end of the cycle, word line WL0 and control lines TG and SAE are left active, and the sense amplifiers 16 remain enabled.

Next, the same row address $RA_0$ is input again, and a sense-amplifier hit cycle commences. The control circuit 26 recognizes that the input row address matches the row address of the data present in the sense amplifiers 16, so it leaves word line WL0 and control lines TG and SAE active. Column addresses $CA_{03}$, $CA_{04}$, and $CA_{05}$ are input, and data $D_{03}$, $D_{04}$, and $D_{05}$ from three more columns are output onto the read data lines RDB and $\overline{\text{RDB}}$. These data can be accessed very rapidly because they are already amplified and present on the sense lines Si and $\overline{\text{Si}}$.

The cache control signal SWc remains inactive throughout this cycle as well, and the cache 10 continues to hold the data of row $RA_1$.

In the next cycle, row address $RA_1$ is input and a cache hit cycle takes place.

Recognizing that row address $RA_1$ differs from the row address $RA_0$ of the data in the sense amplifiers 16, the control circuit 26 deactivates word line WL0 and control lines TG and SAE. When SAE goes low, EQS goes high and the sense lines Si and $\overline{\text{Si}}$ are equalized. This does not affect the bit lines, because the transfer circuit 8 is switched off and the bit lines are disconnected from the sense lines.

In the memory cell array 2, when WL0 has gone low, the storage elements in the memory cells in row $RA_0$ are disconnected from the bit lines, but they continue to store the data that were on the bit lines. Control line EQB is now driven active and the bit lines are equalized to HVcc, as shown in the drawing.

The term "precharge" will be used hereinafter to denote the two operations of deactivating the currently-active word line and then equalizing the bit lines to HVcc. The length of interval 46 is the precharge time of the memory cell array 2.

After the sense lines Si and $\overline{Si}$ have been equalized, the sense amplifiers 16 are again enabled and control line SW is activated. Since REF is inactive, this activates control line SWc, permitting transfer of charge from the cache cells 12 to the sense lines Si and $\overline{Si}$. The data in the cache 10 are thus recalled onto the sense lines Si and $\overline{Si}$ and amplified. This recall of the cached data can be completed more quickly than the reading of data from the memory cell array 2, because the sense lines Si and $\overline{Si}$ are shorter than the bit lines BLi and $\overline{BLi}$ and have less capacitance, and because the potential swing created on the sense lines by the cache cells 12 is greater than the potential swing created on the bit lines and sense lines by the memory cells 4. The sense amplifiers 16 can accordingly amplify data stored in the cache 10 faster than they can amplify data stored in the memory cell array 2.

Moreover, recall of the cached data can begin while the memory cell array 2 is still being precharged, as shown. This also speeds up the response to a cache hit.

As soon as the cached data have been recalled onto the sense lines, they are available for output in response to column addresses $CA_{10}$, $CA_{11}$, and $CA_{12}$. At a certain point during the output, control line TG is reactivated and word line WL1 is driven, coupling the sense lines via the bit lines to the memory cells 4 in row $RA_1$. One reason for this is to refresh the data in row $RA_1$ of the memory cell array 2. Another reason is to update the memory cell contents in any columns in which a write access occurs. As a result, when the cache hit cycle ends, valid data for the accessed row are not only present in the sense amplifiers 16 and cache 10, but have also been copied back to the memory cell array 2, maintaining data consistency between the memory cell array 2 and cache 10.

At the end of this cycle the sense amplifiers 16 are left enabled, word line WL1 is left active, and control lines TG and SWc are left active, in case the same row address $RA_1$ is input again in the next cycle.

In the next cycle illustrated, however, the row address $RA_2$ matches neither the address ($RA_1$) of the data in the sense amplifiers 16 nor the address (also $RA_1$) of the data in the cache 10, so a replace cycle begins.

At the beginning of this cycle, control lines TG and SAE are deactivated, disconnecting the memory cell array 2 from the sense lines Si and $\overline{Si}$ and disabling the sense amplifiers 16. The sense lines Si and $\overline{Si}$ and connected cache cells 12 are equalized to HVcc, and the memory cell array 2 is precharged, storing the data of the previous cycle in the memory cells 4 of row $RA_1$.

At the end of the precharge interval 48, the control circuit 26 outputs row address $RA_2$ to the row decoder 30, which drives word line WL2, transferring data from the memory cells in row $RA_2$ onto the bit lines BLi and $\overline{BLi}$. Then control signals TG and SAE are activated to read these data onto the sense lines Si and $\overline{Si}$ and amplify them. The amplified data become available for output in response to column addresses $CA_{20}$, $CA_{21}$, and $CA_{22}$. Control line SW is also activated, so the amplified data are stored in the cache 10. That is, the cache contents are replaced, so that instead of holding the data for row $RA_1$, the cache 10 now holds the data for row $RA_2$. The reason for making this replacement is so that in a refresh cycle or standby, the cache 10 will retain the most recently accessed data.

The next cycle is a refresh cycle, to refresh the data in row $RAr0$. Control line TG is deactivated and the memory cell array 2 is precharged. Control line SAE is deactivated and EQS is activated, disabling the sense amplifiers 16 and equalizing the sense lines Si and $\overline{Si}$. Then word line WLr0 and control lines TG and SAE are activated, and the sense amplifiers amplify and refresh the data in row $RA_{r0}$.

When the REF signal goes high at the beginning of the refresh cycle, it deactivates control signal SWc. This signal remains inactive for the entire duration of the refresh cycle. At the end of the refresh cycle, accordingly, although the data for row $RA_2$ have been lost from the sense amplifiers, they are retained in the cache 10. If the next access is again to row $RA_2$, the data can be recalled quickly from the cache 10 instead of having to be read from the memory cell array 2.

Thus when the same row is accessed repeatedly, even if the accesses are interrupted by standby intervals in which the sense amplifiers are disabled and the sense lines Si and $\overline{Si}$ are equalized, or refresh cycles in which the sense amplifiers acquire the data of a different row, after each interruption the required data can be quickly recalled from the cache 10.

To retain data in the standby state, the control circuit 26 refreshes the cache 10 by periodically activating the SAE and SW control lines, and refreshes the memory cell array 2 by periodically activating the word lines, SAE, and TG, in response to refresh addresses generated by a counter (not shown). Alternatively, instead of refreshing the cache 10, the control circuit 26 may abandon the cache contents after a certain time, by resetting a flag in the tag circuit 28 to indicate that the cache contents are no longer valid.

Figure 5:
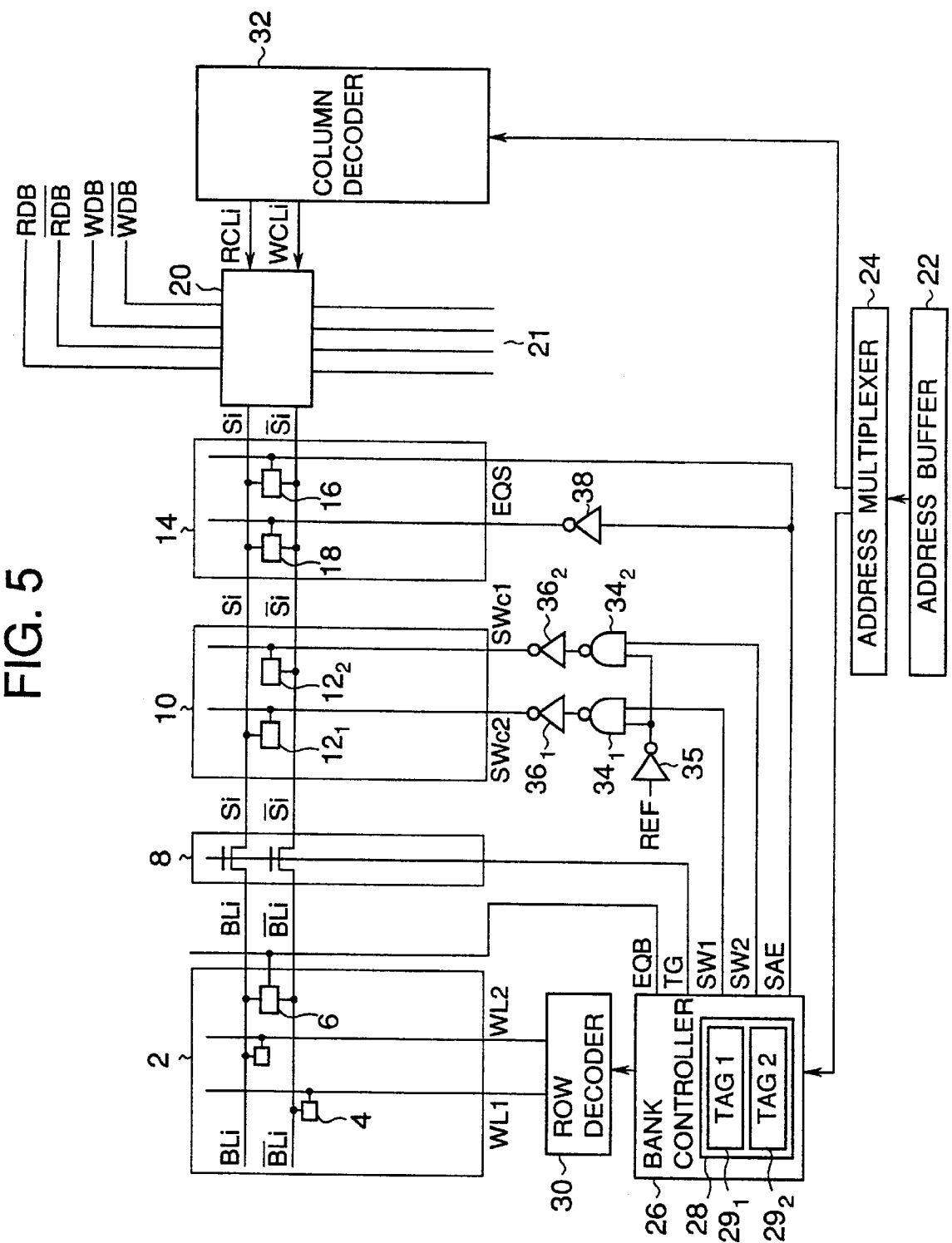
FIG. 5 is a block diagram of a DRAM with two cache rows per row of sense amplifiers.

FIG. 5 is a block diagram showing a DRAM with a larger cache, capable of storing two rows of data. Elements identical to elements in FIG. 1 have the same reference numerals, and descriptions will be omitted.

The cache 10 in this DRAM has two rows of cache cells, so there are two cache cells $12_1$ and $12_2$ per column. The tag circuit 28 in the control circuit 26 accordingly has two tag memories $29_1$ and $29_2$, which store the row addresses of data held in cache cells $12_1$ and $12_2$, respectively, and output corresponding control signals SW1 and SW2. These are fed through respective NAND gates $34_1$ and $34_2$ and inverters $36_1$ and $36_2$ to generate two cache control signals SWc1 and SWc2. Besides storing row addresses, the tag memories $29_1$ and $29_2$ store flag information indicating whether the corresponding cache rows are occupied or empty.

The cache cells such as cell $12_1$ coupled to control line SWc1 will be referred to as the first row of cache cells, or the first cache row; the cache cells such as cell $12_2$ coupled to control line SWc2 as the second row of cache cells, or the second cache row.

The cache cells in FIG. 5 are of the type shown in FIG. 2, cache cell $12_1$ being coupled to sense line Si and cache cell $12_2$ to sense line $\overline{Si}$. This arrangement saves space, but other arrangements are possible. For example, both cache cells $12_1$ and $12_2$ could be of the type shown in FIG. 3.

The operation of this DRAM will be described with reference to the timing diagram in FIG. 6.

Figure 6:
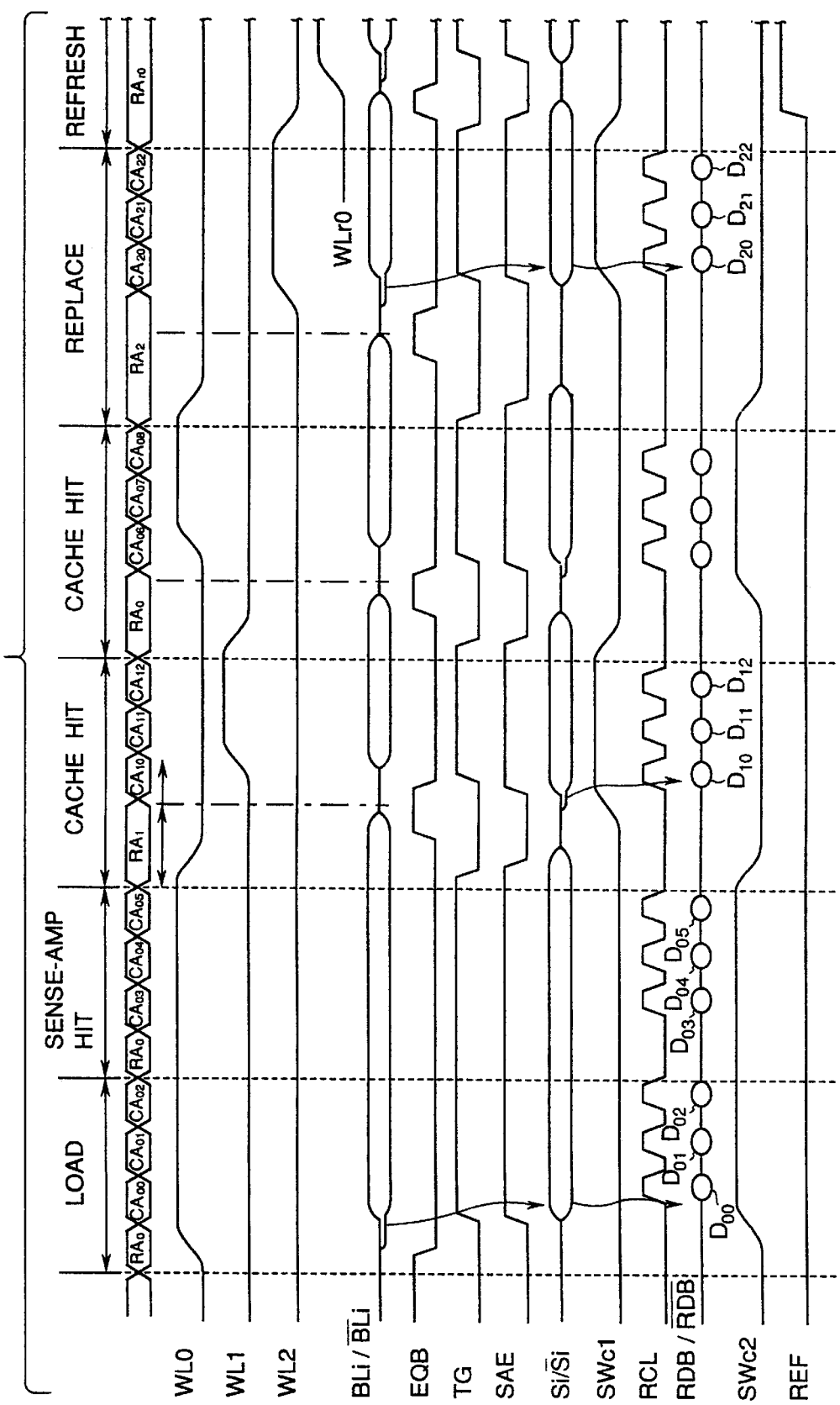
FIG. 6 is a timing diagram illustrating the operation of the DRAM in FIG. 5.

FIG. 6, like FIG. 4, starts from a standby state in which the data of row $RA_1$ are cached. The cached data are held in the first cache row, controlled by signal SWc1. The second cache row is empty.

The sense amplifier load cycle and sense amplifier hit cycle in FIG. 6 are the same as in FIG. 4, except that control line SWc2 is activated, so the data loaded from the memory cell array 2 into the sense amplifiers 16 are also loaded into the second row of cache cells $12_2$.

The cache hit cycle that follows is also identical to the one in FIG. 4, except that control line SWc2 is deactivated at the beginning of the cycle, so that while the data with row address $RA_1$ are being recalled from the first cache row, the data with row address $RA_0$ remain held in the second cache row.

Accordingly, when access reverts from row $RA_1$ to row $R_0$ in the next cycle, another cache hit occurs. The data of row $RA_0$ are now recalled quickly from the second cache row, instead of having to be read from the memory cell array 2. This is done by deactivating control line SWc1, and activating control line SWc2 again. In both cache hit cycles, the relevant word line (WL1 in the first cache hit cycle, WL0 in the second) is activated to refresh the data in the memory cell array 2 and store any updates that might occur due to write access, thereby maintaining data consistency between the memory cell array 2 and cache 10.

In a replace cycle, when the row address $RA_2$ does not match the row of data held in the sense amplifiers 16 or in either cache row, the control circuit 26 selects the cache row holding the least recently accessed data, and replaces the data in that row. In the present case, the data in the first cache row are replaced by activating control line SWc1.

In a refresh cycle, the REF signal deactivates both cache control lines SWc1 and SWc2, and the existing contents of both cache rows are retained. Access to both rows of data held in the cache 10 can accordingly resume quickly after the refresh.

This DRAM is particularly effective when access alternates between two rows, because it allows the data of both rows to be cached for quick recall.

Figure 7:
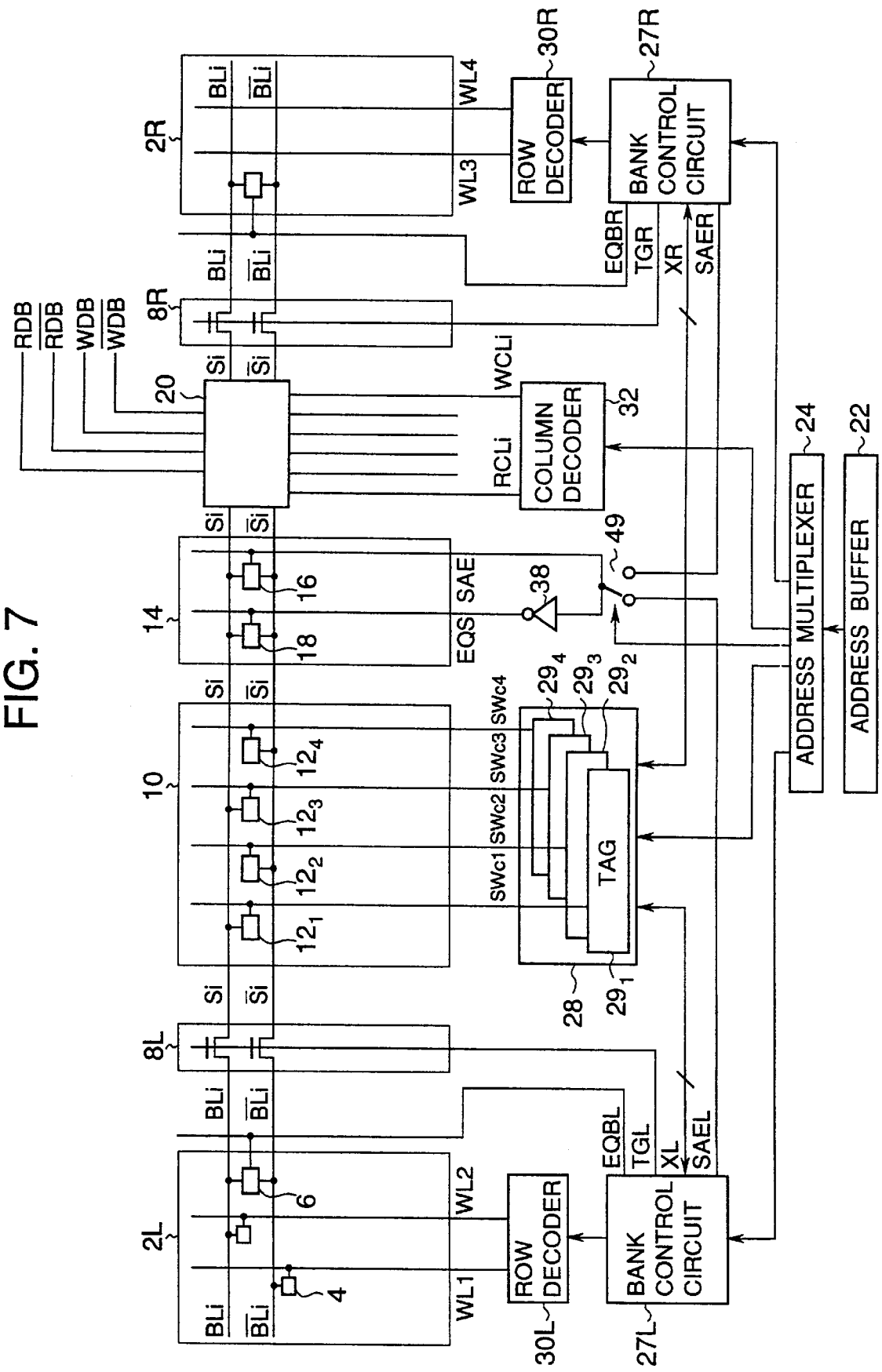
FIG. 7 is a block diagram of a DRAM with four cache rows per row of sense amplifiers.

FIG. 7 shows a DRAM in which the memory cell array is divided into two banks, a left bank 2L and a right bank 2R. A single cache 10 and sense amplifier row 14 are disposed between and shared by the two banks 2L and 2R. The cache 10 now has four cache cells $12_1$, $12_2$, $12_3$, and $12_4$ per column; that is, there are four rows of cache cells. The two banks 2L and 2R share the same column switching circuits 20, and have the same column addresses. The sense lines Si and $\overline{Si}$ are coupled to banks 2L and 2R by respective transfer circuits 8L and 8R, which are controlled by respective control lines TGL and TGR.

The two banks 2L and 2R have separate row addresses, separate row decoders 30L and 30R, and separate bank control circuits 27L and 27R. These bank control circuits are similar to the control circuit 26 in FIGS. 1 and 5, except that the tag circuit 28 is now external to them. This enables the same tag circuit 28 to be shared by both bank control circuits 27L and 27R.

The tag circuit 28 has four tag memories $29_1$, $29_2$, $29_3$, and $29_4$, storing the row addresses of data held in the four cache rows. The four tag memories $29_1$, $29_2$, $29_3$, and $29_4$ generate respective control signals SWc1, SWc2, SWc3, and SWc4 that control the cache rows. Although not explicitly shown, the tag circuit 28 also contains logic gates similar to the inverters and NAND gates in FIGS. 1 and 5 for deactivating control signals SWc1, SWc2, SWc3, and SWc4 during refresh cycles, and other circuits for adjusting the timing of control signals SWc1, SWc2, SWc3, and SWc4.

The tag circuit 28 receives address input directly from the address multiplexer 24.

Bidirectional signal lines XL and XR enable the bank control circuits 27L and 27R to learn when a cache hit occurs, and direct operations such as cache replacement. The bank control circuits 27L and 27R generate the control signals TGL and TGR, as well as control signals EQBL and EQBR to equalize the bit lines in their respective memory banks 2L and 2R, and sense amplifier enable signals SAEL and SAER. A switch 49 controlled by the address multiplexer 24 selects either SAEL or SAER to generate the signals SAE and EQS that control the sense amplifier row 14.

Elements in FIG. 7 not mentioned above are similar to the elements in FIGS. 1 and 5 with the same reference numerals. Omitted to simplify the drawing is a sense-amplifier tag circuit that stores the row address of the data currently held in the sense amplifiers 16.

When a row address is input, the address multiplexer determines which bank 2L or 2R the address lies in, sends the address to the appropriate bank control circuit 27L or 27R, and sets switch 49 to the corresponding position. The row address is also sent to the tag circuit 28, which responds by reporting hit or miss to the bank control circuits. Subsequent operational details are similar to those of the DRAM in FIG. 5, so a timing diagram will be omitted.

The cache 10 in FIG. 7 can be employed in various ways. In one preferred scheme, any of the cache cells $12_1$, $12_2$, $12_3$, and $12_4$ can hold data from either memory bank 2L or 2R. For example, all four cache rows can hold data from the same bank, or three cache rows can hold data from one bank while the fourth row holds data from the other bank, or two cache rows can be used for each bank. This full associativity of the cache 10 results in a high cache hit rate and improves the average data access speed.

In another possible scheme, two of the cache rows, e.g. the two left rows containing cache cells $12_1$ and $12_2$, are reserved for storing data from the left bank 2L. The other two cache rows are reserved for storing data from the right bank.

The concept shown in FIG. 7 can be extended by providing additional memory banks and sense amplifier rows, disposed in an alternating arrangement. Each memory bank can then be served by two adjacent rows of sense amplifiers, so that each sense amplifier row needs sense amplifiers for only one half of the columns. Each sense amplifier row has its own cache.

As mentioned above, one of the advantages of the invented caching scheme is that when a cache hit occurs, cache access can start before the precharging of the memory cell array is completed. Nor is it necessary to wait for existing data to be copied back from the sense amplifiers to the memory cells, because this copy-back is complete at the end of each access cycle, as illustrated in FIGS. 4 and 6. However, cache access still has to wait for the equalization of the sense lines.

Figure 8:
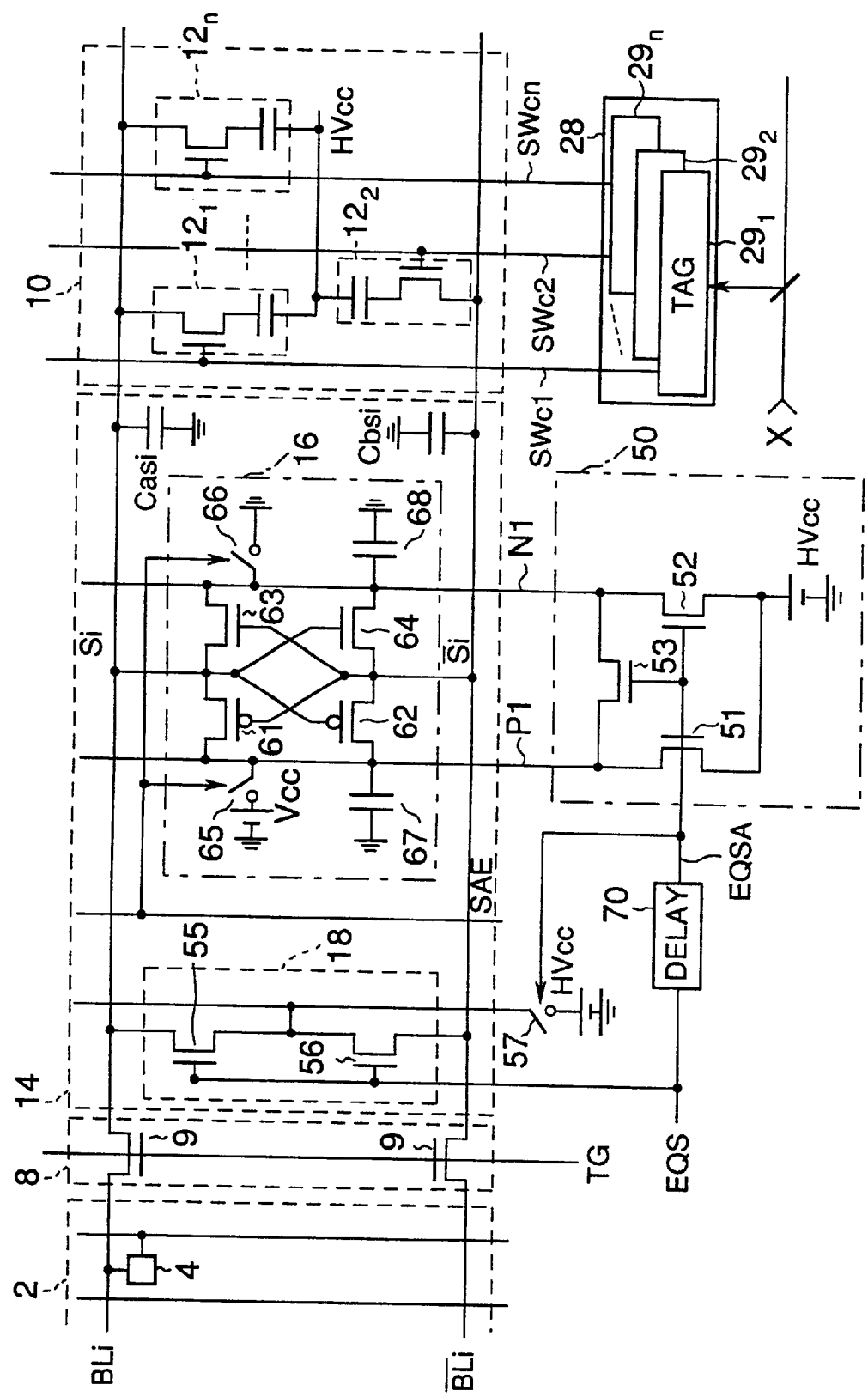
FIG. 8 is a block diagram of a DRAM with a novel circuit for equalizing the sense lines and sense amplifiers.

FIG. 8 shows a scheme for speeding up the equalization of the sense lines. Elements similar to elements in FIGS. 1 to 7 have the same reference numerals. The sense lines Si and $\overline{Si}$ are shown coupled to a single memory cell array 2, but this array 2 may be divided into right and left banks as in FIG. 7. The cache 10 has n cache cells $12_1, \ldots, 12_n$ per column, where n may be any positive integer, from one on up. The cache cells shown are of the type in FIG. 2, but this is not a restriction; the type in FIG. 3 or other types may be used instead. The tag circuit 28 has n tag memories $29_1, \ldots, 29_n$, one for each row of cache cells.

FIG. 8 shows a sense-amplifier equalizing circuit 50 that was omitted to simplify FIGS. 1, 5, and 7. The sense-amplifier equalizing circuit 50 comprises three NMOS transistors 51, 52, and 53, the gates of which are all driven by the same control signal line EQSA. NMOS transistor 53 is connected across two sense-amplifier drive lines P1 and N1, its source coupled to N1 and its drain to P1. NMOS transistors 51 and 52 are coupled between these two sense-amplifier drive lines P1 and N1, respectively, and a source of the intermediate potential HVcc.

FIG. 8 also shows the detailed structure of the equalizing circuit 18 that equalizes the sense lines Si and $\overline{\text{Si}}$. This sense-line equalizing circuit 18 comprises NMOS transistors 55 and 56 coupled in series between the sense lines Si and $\overline{\text{Si}}$, the gates of both transistors 55 and 56 being controlled by control signal EQS. The intermediate potential HVcc is supplied through a switch 57 to a node between the two NMOS transistors 55 and 56. Switch 57 is controlled by control signal EQSA.

FIG. 8 furthermore shows the detailed structure of the sense amplifier 16. A sense amplifier is configured as a differential amplifier comprising P-channel metal-oxide-semiconductor (PMOS) transistors 61 and 62 and NMOS transistors 63 and 64 cross-coupled between the sense lines Si and $\overline{\text{Si}}$. The sources of PMOS transistors 61 and 62 are coupled to drive line P1, which receives the power-supply potential Vcc through a switch 65. The sources of NMOS transistors 63 and 64 are coupled to drive line N1, which receives the ground potential through a switch 66. Switches 65 and 66 are controlled by the sense-amplifier enable signal SAE. The drive lines P1 and N1 are also coupled through capacitors 67 and 68 to fixed potentials such as the ground potential, to stabilize the sense-amplifier driving potentials.

The sense lines Si and $\overline{\text{Si}}$ have intrinsic capacitances, which are indicated in FIG. 8 by capacitor symbols Casi and Cbsi. These symbols do not denote separate capacitors connected to the sense lines. Rather, they denote the so-called stray capacitance of the sense lines themselves.

Control signal EQSA is generated from control signal EQS by a delay circuit 70 that inputs EQS and outputs EQSA. This delay circuit is preferably configured so that the rise of EQSA is delayed from the rise of EQS, but EQSA and EQS fall together. Delay circuits of this type are well known: one possible configuration comprises an even number of inverters coupled in series with an AND gate.

The sense-amplifier drive lines P1 and N1 extend in the row direction and are coupled to all sense amplifiers 16 in the sense amplifier row 14. Similarly, switch 57 controls the supply of the HVcc potential to all equalizing circuits 18 in the sense amplifier row 14.

Figure 9:
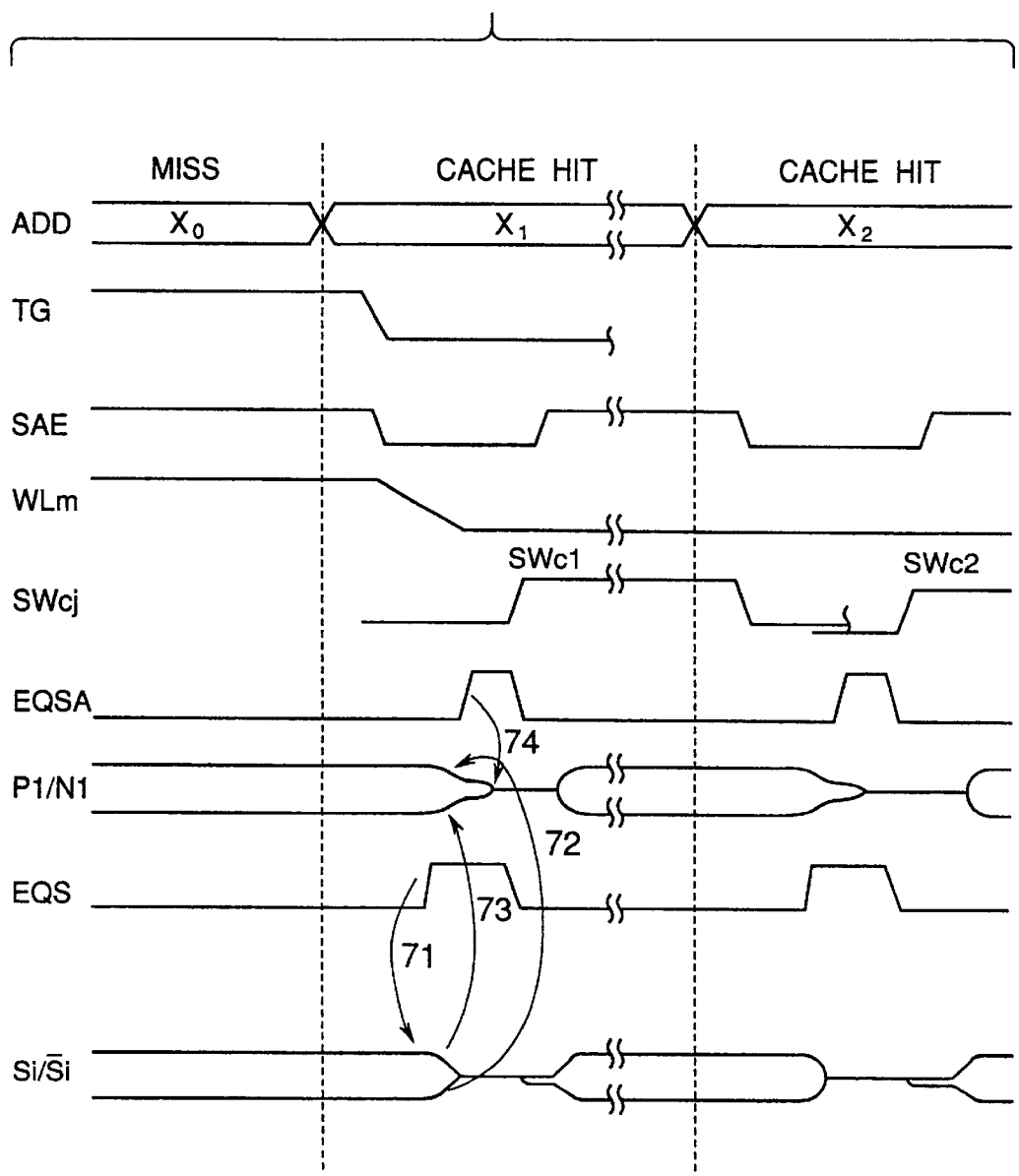
FIG. 9 is a timing diagram illustrating the operation of the circuit in FIG. 8.

FIG. 9 is a timing diagram illustrating the equalization of the sense lines in two cache hit cycles. On the address bus ADD at the top of FIG. 9, $X_1$ and $X_2$ are row addresses matching the addresses in tag circuits $29_1$ and $29_2$, indicating that the data addressed by $X_1$ and $X_2$ are held in the first two rows in the cache 10. Row address $X_0$ is a row address for which data were not held in the cache 10, resulting in access to the memory cell array 2. Column addresses are omitted, since they are not relevant to the equalization process.

Access to row $X_0$ results in word line WLm being activated, and the data from its coupled memory cells being read from the memory cell array 2 onto the sense lines Si and $\overline{\text{Si}}$ and amplified. Signal line SAE is active to enable the sense amplifiers 16, while EQS and EQSA are inactive. The Vcc and Vss (ground) potentials are accordingly supplied to the sense-amplifier drive lines P1 and N1, and the sense lines Si and $\overline{\text{Si}}$ are not equalized.

When row address $X_1$ is input and a cache hit occurs, control signals TG and SAE are deactivated, placing the transfer circuit 8 in the off state, and turning off the switches 65 and 66 in the sense amplifiers. The sense-amplifier drive lines P1 and N1 are thereby disconnected from the power supply and ground, but they remain for the time being at their existing Vcc and Vss potentials. Word line WLm is also deactivated and the memory cell array 2 is precharged.

Shortly after control line SAE becomes inactive, control line EQS becomes active, turning on transistors 55 and 56 in the equalizing circuit 18. The opposite charges stored in the stray capacitances Casi and Cbsi of the sense lines Si and $\overline{\text{Si}}$ now begin to discharge toward each other through these transistors 55 and 56. This event is indicated by arrow 71 in FIG. 9. For example, if sense line Si is high while $\overline{\text{Si}}$ is low, then charge is transported through transistors 55 and 56 from sense line Si to sense line $\overline{\text{Si}}$, causing the potential of sense line $\overline{\text{Si}}$ to rise and the potential of sense line Si to fall.

In the sense amplifier 16, because Si was high and $\overline{\text{Si}}$ low, transistors 61 and 64 were turned on, while transistors 62 and 63 were turned off. When the potential of sense line Si falls below $Vcc-V_{tp}$ (where $V_{tp}$ is the PMOS threshold value), PMOS transistor 62 turns on, allowing charge to flow from sense-amplifier drive line P1, which is still at Vcc, onto sense line $\overline{\text{Si}}$, thereby accelerating the equalization of sense line $\overline{\text{Si}}$. This is indicated by arrow 72 in FIG. 9. Likewise, when the potential of sense line $\overline{\text{Si}}$ rises above the NMOS transistor threshold value $V_{tn}$, transistor 63 turns on, and charge can flow from sense line Si to the ground-level sense-amplifier drive line N1, as indicated by arrow 73. Thus the charges remaining on sense-amplifier drive lines P1 and N1 are used to speed up the equalization of sense lines Si and $\overline{\text{Si}}$.

After a delay due to the delay circuit 70, control line EQSA becomes active, turning on transistors 51, 52, and 53 in the sense-amplifier equalizing circuit 50, and supplying HVcc to the sense-amplifier drive lines P1 and N1. EQSA also turns on switch 57 and supplies the intermediate potential HVcc to the sense-line equalizing circuits 18. The sense-amplifier drive lines P1 and N1 and sense lines Si and $\overline{\text{Si}}$ are thereby all equalized to HVcc.

As explained above, delaying the activation of control signal EQSA accelerates the equalization of the sense lines Si and $\overline{\text{Si}}$ by providing additional charge and discharge paths 72 and 73 through the sense amplifier 16. These paths would not exist if the sense-amplifier drive lines P1 and N1 were equalized immediately to HVcc. In the case described above, transistors 62 and 63 would not turn on; the gate potential of NMOS transistor 63, for example, would be lower than its HVcc source potential.

After equalization is completed, signals EQS and EQSA are deactivated simultaneously, control signal SWc1 is activated, and the data in the first cache row are read onto the sense lines Si and $\overline{\text{Si}}$. Control line SAE is activated, the sense-amplifier drive lines P1 and N1 are powered, and the cached data are amplified. Column addresses (not indicated in FIG. 9) can then be input to access the data.

The next access cycle is a cache hit by row address $X_2$. Control signal SWc1 is deactivated, and the pair of sense lines Si and $\overline{\text{Si}}$ are equalized in the same rapid manner as before. This is followed by activation of control signal SWc2 and access to the data in the second cache row.

The quick equalization of sense lines Si and $\overline{\text{Si}}$ due to the delay of EQSA from EQS is beneficial in cache miss cycles as well as cache hit cycles, but it is particularly valuable in permitting rapid access to the cache 10.

Figure 10:
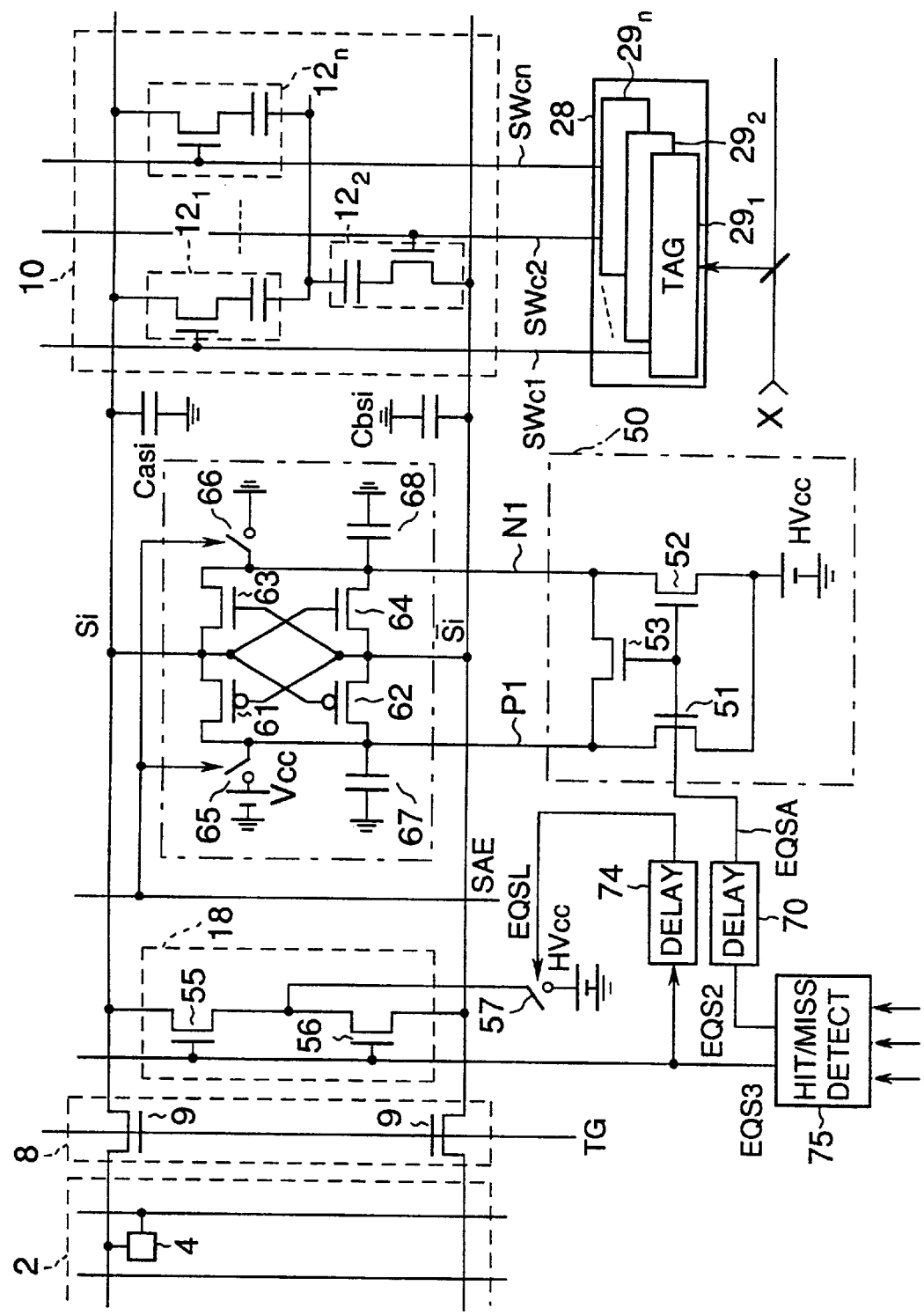
FIG. 10 is a block diagram of a DRAM with another novel circuit for equalizing the sense lines and sense amplifiers.

FIG. 10 shows a scheme for further speeding up access to the cache 10, and reducing current dissipation. Elements which are the same as elements in FIG. 8 have the same reference numerals.

In FIG. 10 the sense-amplifier equalizing circuit 50 and switch 57 are activated by separate control signals EQSA and EQSL, which have respective delay circuits 70 and 74. The inputs EQS2 and EQS3 to these delay circuits 70 and 74 are generated by a hit/miss detector 75, the function of which is to prevent activation of the sense-amplifier equalizing circuit 50 in a cache-hit cycle.

Figure 11:
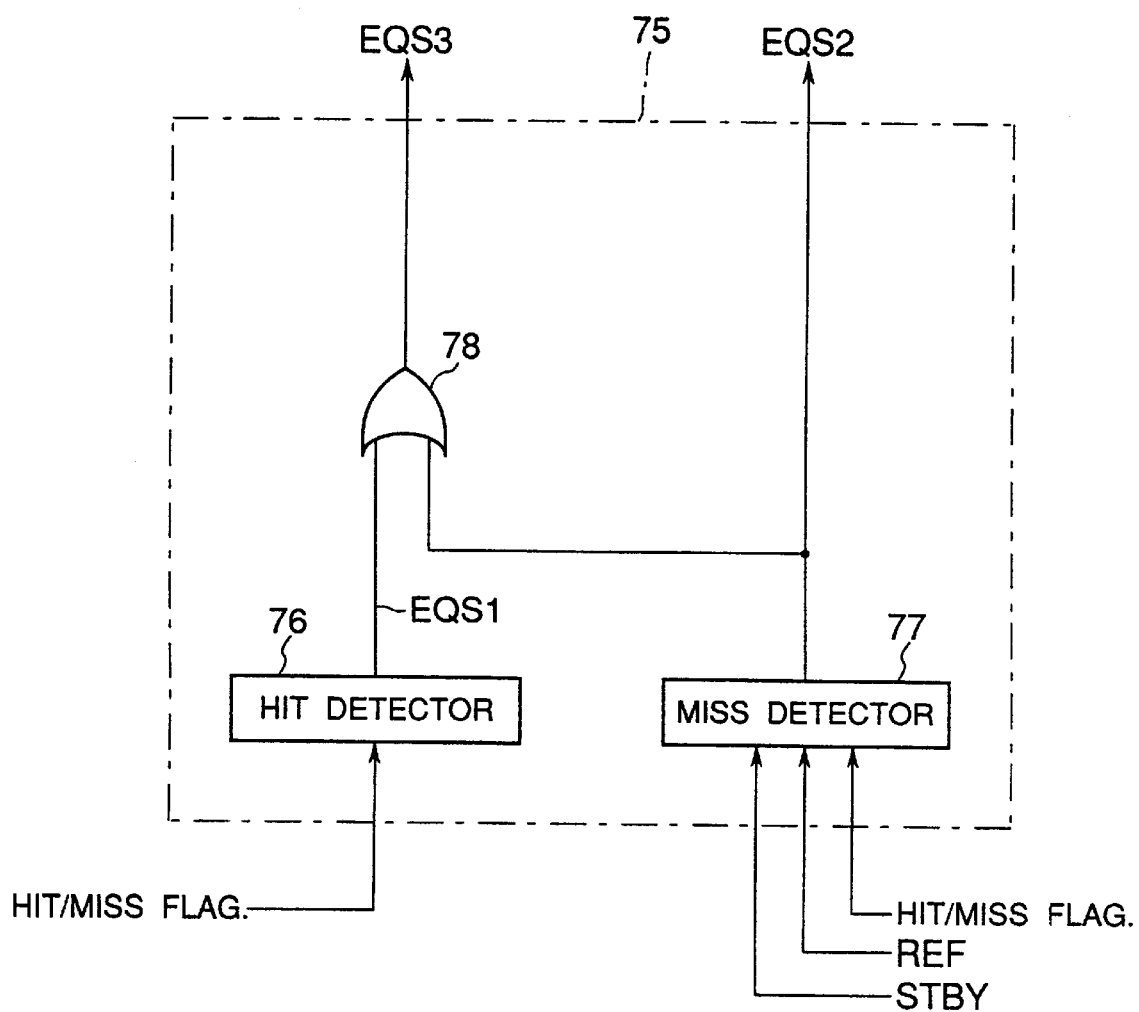
FIG. 11 is a circuit diagram of the hit/miss detector in FIG. 10.

FIG. 11 shows an example of the internal structure of the hit/miss detector 75. This hit/miss detector 75 comprises a hit detector 76 that outputs an internal signal EQS1, a miss detector 77 that outputs control signal EQS2, and a logic circuit, more specifically an OR gate 78, that takes the logical OR of EQS1 and EQS2 to generate control signal EQS3.

The hit detector 76 receives, for example, a hit/miss flag signal from the tag circuit 28, and activates signal EQS1 when a cache hit occurs. The miss detector 77 also receives the hit/miss flag signal, together with a REF signal indicating a refresh cycle, and a STBY signal indicating standby. Control signal EQS2 is activated when a cache miss occurs, or a refresh cycle occurs, or the standby state is entered.

The hit detector 76 and miss detector 77 also receive signals indicating occurrence of a sense-amplifier hit, in which case neither EQS1 nor EQS2 is activated, because the data are already present in the sense amplifiers 16.

Figure 12:
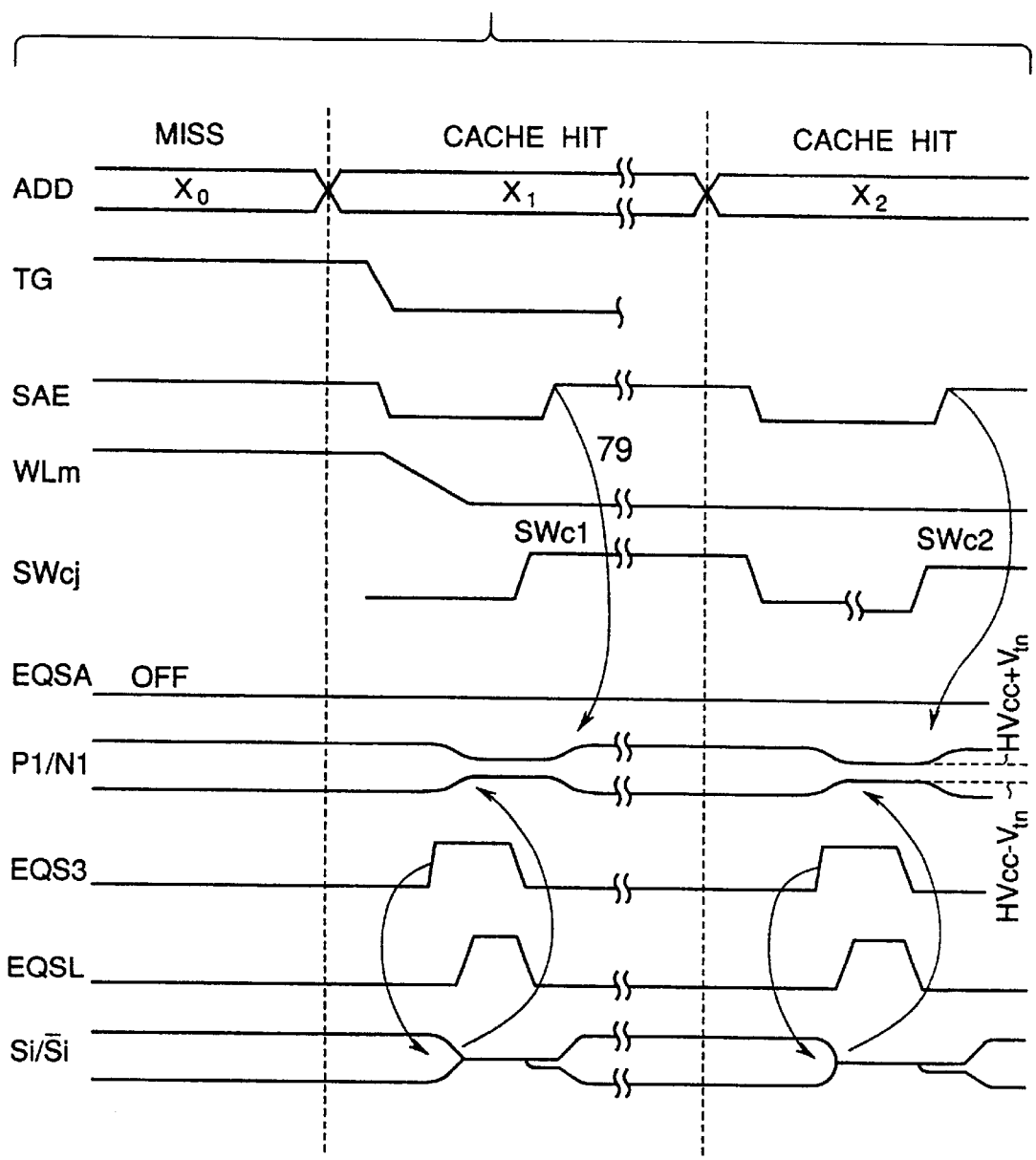
FIG. 12 is a timing diagram illustrating the operation of the circuit in FIG. 10.

FIG. 12 is a timing diagram illustrating equalization of the sense lines in two cache hit cycles by the circuits shown in FIGS. 10 and 11. Row addresses $X_0$, $X_1$, and $X_2$ have the same meaning as in FIG. 9.

Equalization of the sense lines Si and $\overline{Si}$ proceeds as in FIG. 9, speeded by the transfer of charge between the sense lines Si and $\overline{Si}$ and the sense-amplifier drive lines P1 and N1. After a delay due to delay circuit 74, control line EQSL is activated and the sense lines Si and $\overline{Si}$ are brought to HVcc. In a hit cycle, however, control line EQSA remains inactive, so HVcc is not supplied to the sense-amplifier drive lines P1 and N1.

Assuming again that sense line Si was high and $\overline{Si}$ low, when the potential on sense-amplifier drive line P1 falls to $HVcc+V_{tp}$, the potential on sense line Si, which is at least HVcc, can no longer turn on PMOS transistor 62, so no more charge flows from sense-amplifier drive line P1 to sense line $\overline{Si}$. Similarly, when the potential on sense-amplifier drive line N1 reaches $HVcc-V_{tn}$, NMOS transistor 63 turns off, and the flow of charge from sense line Si to sense-amplifier drive line N1 ceases. Sense-amplifier drive line P1 therefore remains at $HVcc+V_{tp}$, while sense-amplifier drive line N1 remains at $HVcc-V_{tn}$.

When equalization of the sense lines Si and $\overline{Si}$ has ended, sense-amplifier drive lines P1 and N1 remain unequalized at $HVcc+V_{tp}$ and $HVcc-V_{tn}$, and control line SWc1 is activated by the tag circuit 28. Since the sense lines are short and their intrinsic capacitances Casi and Cbsi are comparatively small, the charge in cache cell $12_1$ produces a fairly large potential swing on sense line Si. Accordingly, when control line SAE is activated to supply power to the sense amplifier 16, even though the sense amplifier drive lines P1 and N1 were not fully equalized, the potential difference between sense lines Si and $\overline{Si}$ is large enough to be amplified correctly.

In the following cache hit cycle the same process is repeated to access the data in cache cell $12_2$. The sense-amplifier drive lines P1 and N1 are again left unequalized.

When control line SAE is activated to amplify the cached data (arrow 79), control line TG must be inactive so that the sense amplifiers 16 do not have to contend with the large stray capacitance of the bit lines BLi and $\overline{BLi}$. After amplification is completed, although not shown in FIG. 12, control line TG can be activated to copy data back from the sense lines Si and $\overline{Si}$ to the memory cells 4.

Omitting the equalization of the sense-amplifier drive lines P1 and N1 makes it possible to advance very quickly to the access of cached data. In addition, not equalizing the sense-amplifier drive lines P1 and N1 reduces current dissipation in a cache hit.

Figure 13:
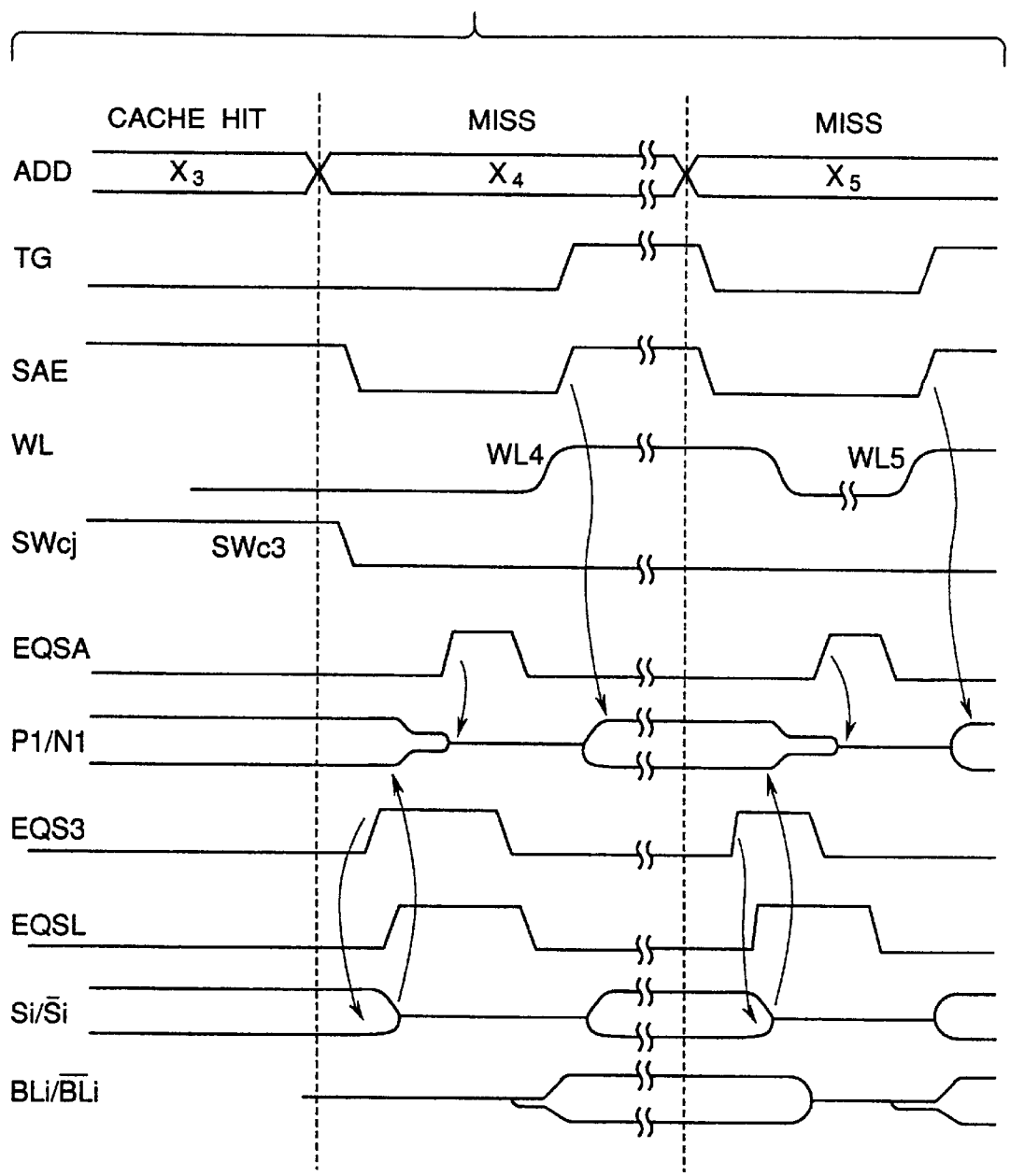
FIG. 13 is another timing diagram illustrating the operation of the circuit in FIG. 10.

FIG. 13 illustrates the equalization operations performed by the circuits in FIGS. 10 and 11 in a cache miss cycle.

After a cache hit on, for example, the third cache row caused by row address $X_3$, the next row address $X_4$ does not match the address held in any tag memory, so the memory cells 4 must be accessed. Control line SWc3 is deactivated by the tag circuit 28, control line SAE is deactivated, switches 65 and 66 in sense amplifier 16 are placed in the off state, and sense-amplifier drive lines P1 and N1 are disconnected from the power supply and ground. The hit/miss detector 75 activates control lines EQS2 and EQS3, and after a delay inserted by the delay circuit 74, control line EQSL is activated, equalizing the sense lines Si and $\overline{Si}$. Delay circuit 70 keeps control line EQSA inactive during this time so as to speed up the equalization by using the charge remaining on the sense-amplifier drive lines P1 and N1, as already explained.

After the sense lines Si and $\overline{Si}$ have been equalized, the delay circuit 70 activates control line EQSA, equalizing the sense-amplifier drive lines P1 and N1 to HVcc. Next, control lines EQS2, EQS3, EQSA, and EQSL are deactivated, control line TG is activated to couple the sense lines to the bit lines, the word line WL4 corresponding to row address $X_4$ is activated, control line SAE is activated to enable the sense amplifiers 16, and data are transferred from the memory cells 4 coupled to word line WL4 onto the bit lines BLi and $\overline{BLi}$ and sense lines Si and $\overline{Si}$. Due to the large capacitance of the bit lines BLi and $\overline{BLi}$, the resulting potential swing is small, but the potential difference is sensed and amplified correctly by the sense amplifiers 16, because their drive lines P1 and N1 start from the equalized potential HVcc.

The next cycle is also a cache miss, the input row address $X_5$ not matching the address in any tag circuit. Once again, this is detected by the hit/miss detector 75, and the sense-amplifier drive lines P1 and N1 as well as the sense lines Si and $\overline{Si}$ are equalized to the intermediate potential HVcc.

The hit/miss detector 75 activates the sense-amplifier equalizing circuit 50 to equalize the sense-amplifier drive lines P1 and N1 not only in cache miss cycles, but also in refresh cycles, because in refresh cycles as well, the sense amplifiers 16 must amplify small potential differences on the bit lines. Furthermore, the sense-amplifier drive lines P1 and N1 are equalized in the standby state, to prevent the flow of unwanted leakage current.

In the embodiments shown so far, the cache has been coupled directly to the sense lines. Although the cache provides major benefits by enabling quick recall of cached data, and retaining cached data during refresh cycles, this arrangement does not permit the cached data to be accessed during refresh cycles. Thus if the memory device has an auto-refresh function and generates its own refresh cycles, each time one of these refresh cycles occurs, external access must be delayed until the refresh cycle ends.

Figure 14:
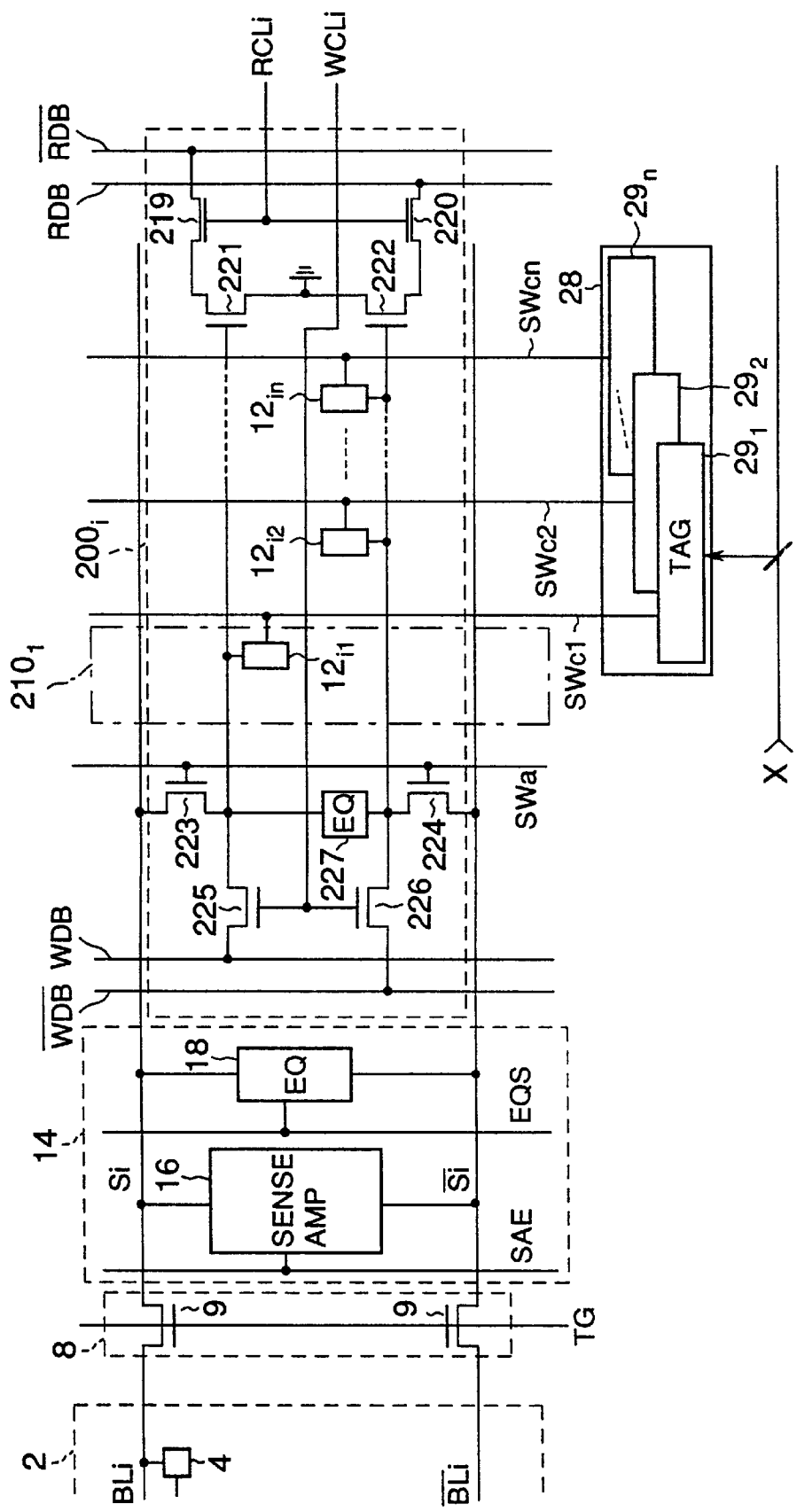
FIG. 14 illustrates a DRAM having column switching circuits with internal cache cells.

FIG. 14 is a circuit drawing of part of a DRAM in which cache cells are disposed in the column switching circuits. Elements identical to elements in FIGS. 1 to 10 have the same reference numerals. Although only a single memory cell array 2 is shown, it may be divided into two banks as in FIG. 7. The sense amplifier row 14 preferably has equalizing circuits structured as in FIG. 8 or 10, but for simplicity only control lines SAE and EQS are shown.

The novel column switching circuit $200_i$, like the conventional column switching circuit 20 in FIGS. 1 to 7, interfaces the sense lines Si and $\overline{Si}$ to the read data lines RDB and $\overline{RDB}$ and write data lines WDB and $\overline{WDB}$. Unlike the conventional circuit, the column switching circuit $200_i$ has n cache cells $12_{i1}, \ldots 12_{in}$, where n may be any positive integer. The subscript i is being used to identify elements belonging to the i-th column, which will be useful in discussing write access.

The cache cells $12_{ij}$ are coupled to a pair of complementary column data lines CDi and $\overline{CDi}$. Data transfer between the cache cells $12_{ij}$ and column data lines CDi and $\overline{CDi}$ is controlled by cache control signals SWcj (j=1, 2, ..., n). As in the preceding embodiments, these cache control signals are output from a tag circuit 28 with tag memories $29_j$ (j=1, 2, ..., n). The cache cells $12_{1j}, 12_{2j}, \ldots$ controlled by the same control line SWcj will be referred to as the j-th cache row $210_j$. FIG. 14 explicitly indicates the first cache row $210_1$. All of the cache cells $12_{ij}$ will continue to be referred to collectively as the cache, even though the cache cells $12_{ij}$ are disposed in different column switching circuits $200_i$.

The cache cells $12_{ij}$ have, for example, the structure shown in FIG. 2 or 3, except that they are coupled to the column data lines instead of the sense lines.

The read column line RCLi drives the gates of two NMOS transistors 219 and 220 which are coupled to read data lines RDB and $\overline{RDB}$, respectively. Two more NMOS transistors 221 and 222, with gates controlled by the column data lines CDi and $\overline{CDi}$, are coupled in series between transistors 219 and 220. The sources of NMOS transistors 221 and 22 are supplied with a fixed potential such as the ground potential (Vss). Transistors 221 and 222 form a simple amplifier that enables a small potential swing on the column data lines CDi and $\overline{CDi}$ to produce a larger potential swing on the read data lines RDB and $\overline{RDB}$. (Similar amplifiers may be employed in the column switching circuits 20 of FIGS. 1 to 7.)

Sense lines Si and $\overline{Si}$ are coupled to the corresponding column data lines CDi and $\overline{CDi}$ through respective NMOS transistors 223 and 224, the gates of which are coupled to a control line SWa. The column data lines CDi and $\overline{CDi}$ are coupled to the write data lines WDB and $\overline{WDB}$ through respective NMOS transistors 225 and 226, the gates of which are driven by the write column line WCLi. An equalizing circuit 227, similar to the sense line equalizing circuit 18 for example, is provided to equalize the column data lines CDi and $\overline{CDi}$. The control line of the column-data-line equalizing circuit 227 is not explicitly shown, but it is different from the EQS control line of the sense-line equalizing circuit 18, permitting the sense lines Si and $\overline{Si}$ to be equalized while the column data lines CDi and $\overline{CDi}$ remain unequalized, or vice versa.

First, the operation of control lines SWa, WCLi, and RCLi will be briefly described.

When control line SWa is activated, NMOS transistors 223 and 224 turn on, coupling the sense lines Si and $\overline{Si}$ to the column data lines CDi and $\overline{CDi}$, so that the same data appear on both Si/$\overline{Si}$ and CDi/$\overline{CDi}$. This occurs simultaneously in all columns. When SWa is inactive, the sense lines Si and $\overline{Si}$ are disconnected from the column data lines CDi and $\overline{CDi}$.

When control line WCLi is activated, NMOS transistors 225 and 226 turn on, and data present on the write data lines WDB and $\overline{WDB}$ are transferred to the column data lines CDi and $\overline{CDi}$.

When control line RCLi is activated, transistors 219 and 220 turn on. Both read data lines RDB and $\overline{RDB}$ are initially precharged to a certain potential such as the power-supply potential Vcc. If data are present on the column data lines CDi and $\overline{CDi}$, so that one of these lines is high while the other is low, then one of the NMOS transistor transistors 221 and 222 will be turned on while the other is turned off. If column data line CDi is high, for example, then transistor 221 will turn on, pulling read data line $\overline{RDB}$ down to the ground level. Transistor 222 will remain off, so read data line RDB is not coupled to ground and remains high. In this way the data on the column data lines CDi and $\overline{CDi}$ are transferred to the read data lines RDB and $\overline{RDB}$.

Although the input-output circuits coupled to the data bus lines are not shown, these circuits should be configured so that data can be transferred from the write data lines WDB and $\overline{WDB}$ to the column data lines CDi and $\overline{CDi}$ and then to the read data lines RDB and $\overline{RDB}$, or from the cache cells 12ij to the column data lines CDi and $\overline{CDi}$ and then to the read data lines RDB and $\overline{RDB}$, without amplification by the sense amplifiers 16.

Figure 15:
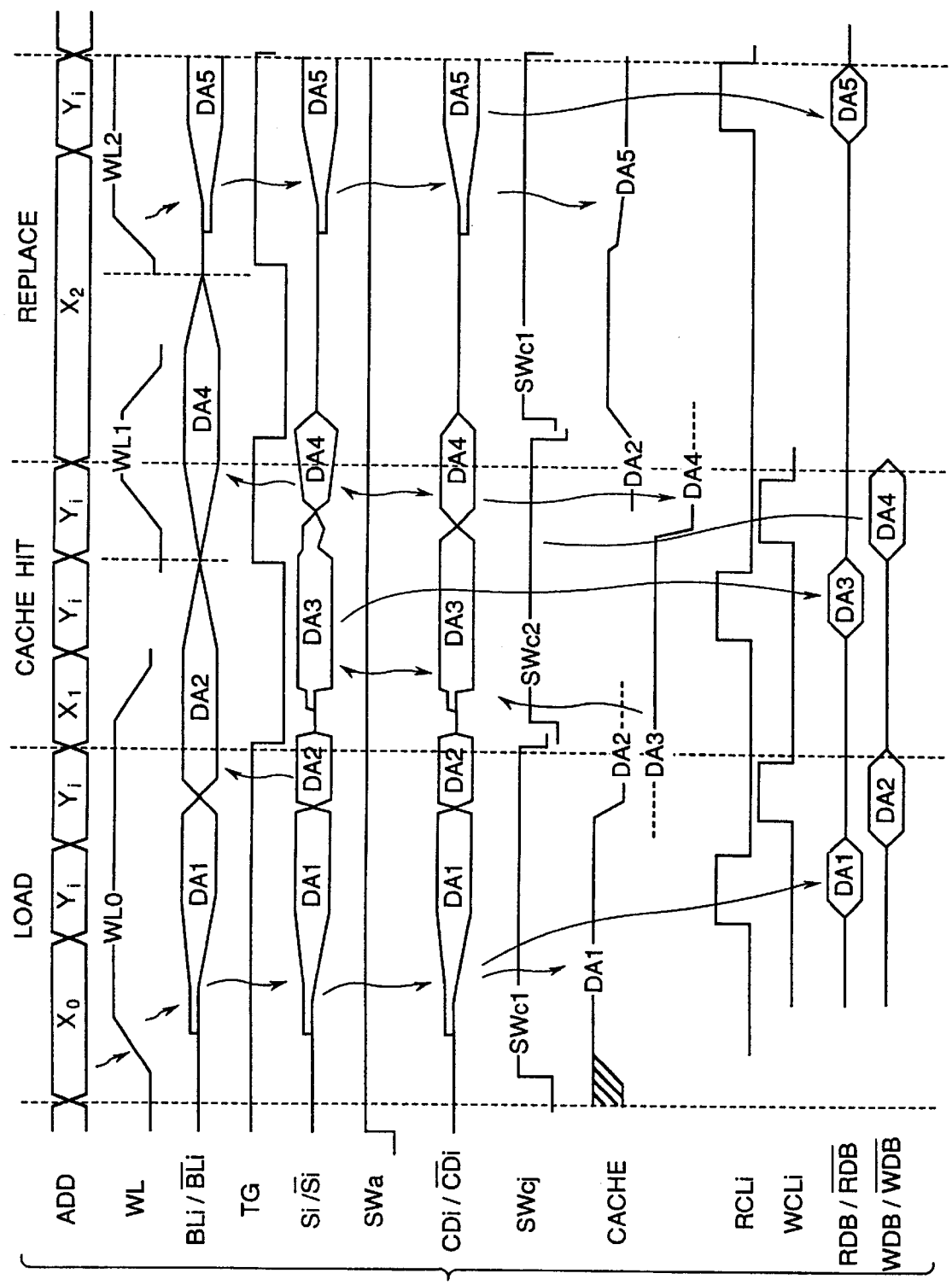
FIG. 15 is a timing diagram illustrating the operation of the DRAM in FIG. 14.
Figure 16:
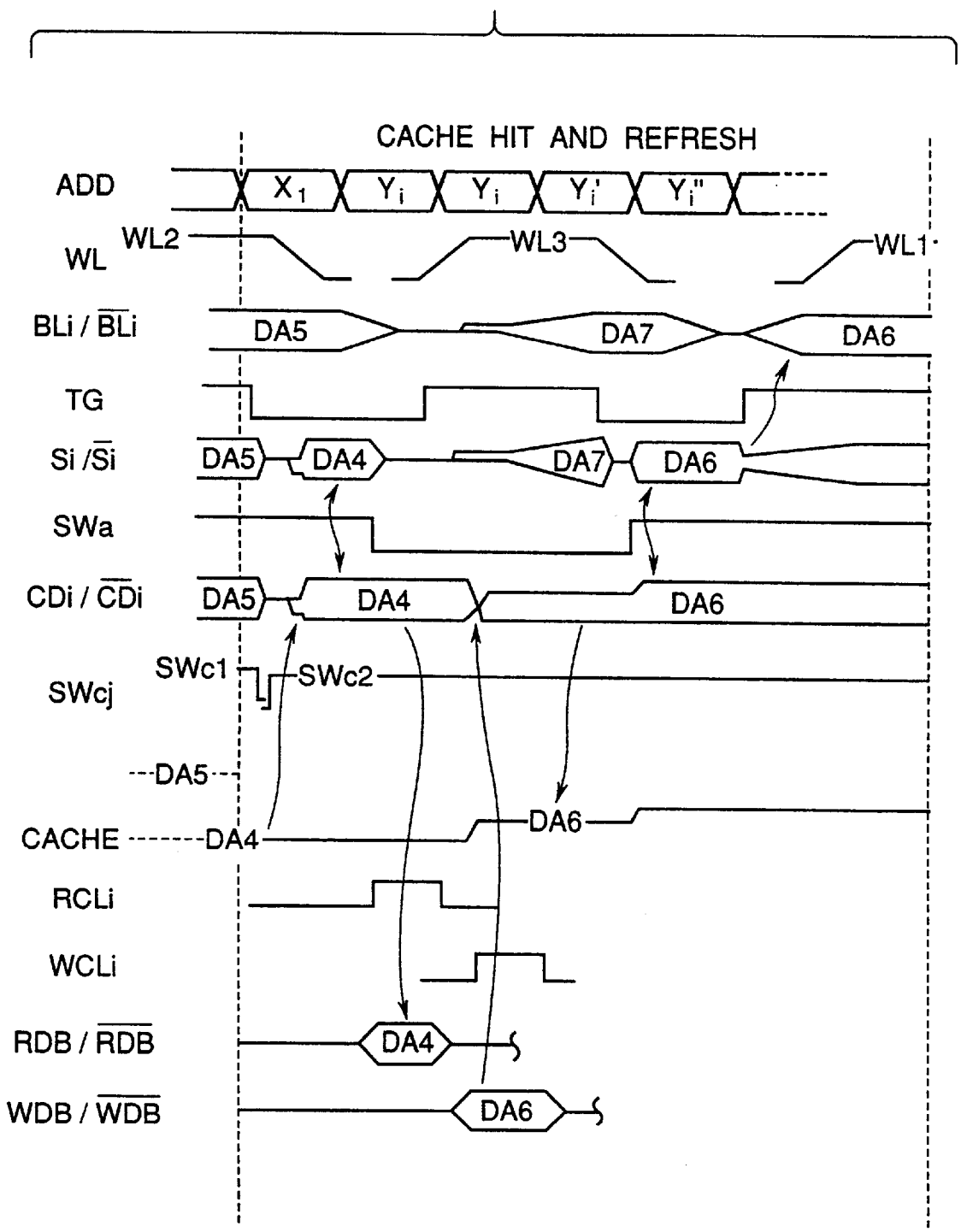
FIG. 16 is another timing diagram illustrating the operation of the DRAM in FIG. 14.

FIGS. 15 and 16 illustrate the operation of the DRAM in FIG. 14 in a cache load cycle, cache hit cycle, cache replace cycle, and combined cache hit and refresh cycle. Both read and write access are shown. On the address bus ADD, addresses $X_0, X_1, X_2, \ldots$ are row addresses that select corresponding word lines WL0, WL1, WL2, ..., while $Y_i, Y'_i, Y''_i, \ldots$ are column addresses.

A feature of the operation of this DRAM is that, as in the preceding embodiments, the cache contents are kept consistent with the memory cell contents; in every cycle, any newly input write data are copied back to the memory cell array 2. More precisely, all data present on the sense lines at the end of a cycle have also been copied back to the memory cell array 2 by the end of that cycle.

(1) Cache Load Cycle

A cache load cycle occurs when an input row address does not match the address of any cached data, but there exists an empty cache row (a cache row that does not hold valid data). The data in the addressed row are then read from the memory cell array onto the sense lines, and also loaded into the empty cache row, as follows.

Referring to FIG. 15, if row address $X_0$ does not match the row address held in any tag memory $29_j$, and cache row $210_1$ is empty, then the tag circuit 28 drives control line SWc1 to the active state. The word line WL0 corresponding to row address $X_0$ is also activated. Transfer circuit 8 is turned on by control line TG, so the data DA1 in row $X_0$ are read out of their memory cells via the bit lines BLi and $\overline{BLi}$ and amplified, thus appearing on the sense lines Si and $\overline{Si}$. Control line SWa is active, so the sense lines are coupled to the column data lines CDi and $\overline{CDi}$, on which data DA1 also appear. Since control line SWc1 is active, the data DA1 are loaded into the first cache row $210_1$.

Next, an external read/write control signal (not shown) is placed in the read state, and a column address $Y_i$ is input. This activates the corresponding read column line RCLi, transferring data DA1 onto the pair of read data lines RDB and $\overline{RDB}$ as explained above. Since the NMOS transistors 221 and 222 that drive the read data lines RDB and $\overline{RDB}$ act as amplifiers, data DA1 can be read onto the read data lines RDB and $\overline{RDB}$ even before amplification by the sense amplifier 16 is completed.

The read/write signal is now placed in the write state to write to the same column address $Y_i$. This causes the write control line WCLi in the i-th column to go high, transferring data DA2 from the pair of write data lines WDB and $\overline{\text{WDB}}$ to the pair of column data lines CDi and $\overline{\text{CDi}}$, thence to cache cell $12_{i1}$ in cache row $210_1$ and the pair of sense lines Si and $\overline{\text{Si}}$. Control line TG remains active, so data DA2 are transferred from the sense lines Si and $\overline{\text{Si}}$ to the bit lines BLi and $\overline{\text{BLi}}$ and copied back into the corresponding memory cell. At most one pair of bit lines, namely BLi and $\overline{\text{BLi}}$ in the i-th column, has to be charged or discharged in this copy-back operation, so it is completed quickly. As soon as BLi and $\overline{\text{BLi}}$ are fully charged and discharged, the next cycle can begin.

Control lines TG, SWa, and SWc1 and word line WL0 are left active at the end of this cycle, so that if row address $X_0$ is input again, access can continue immediately using the data remaining in the sense amplifiers, sense lines Si and $\overline{\text{Si}}$, and column data lines CDi and $\overline{\text{CDi}}$.

Although the same column address $Y_i$ was accessed for both read and write above, the read and write column addresses can of course be different. Nor is the cycle limited to one read access and one write access; multiple read accesses and multiple write accesses to different columns in the same row are possible. There is no restriction on the order of accesses; read may precede write, or vice versa.

(2) Cache Hit Cycle

A cache hit cycle occurs when a new row address is input and it matches one of the row addresses held in the tag circuit. The sense lines are then disconnected from the bit lines, and the data for the addressed row are recalled from the cache. At the end of the cycle, the bit lines are coupled to the sense lines again to write any updated data back to the memory cells.

Assume, for example, that row address $X_1$ matches the address held in tag memory $29_2$, indicating that the data of this row are currently stored in cache row $210_2$. Control line TG is deactivated to disconnect the sense lines Si and $\overline{\text{Si}}$ from the bit lines BLi and $\overline{\text{BLi2L}}$, and the tag circuit 28 deactivates cache control line SWc1, disconnecting cache row $210_1$ from the column data lines CDi and $\overline{\text{CDi}}$. The data for row address $X_0$ are now held in the first cache row $210_1$, and are still present on the bit lines BLi and $\overline{\text{BLi}}$ and their connected memory cells.

Next the sense lines Si and $\overline{\text{Si}}$ and column data lines CDi and $\overline{\text{CDi}}$ are equalized, then cache control line SWc2 is activated by the tag circuit 28, transferring the data from cache row $210_2$ onto the column data lines CDi and $\overline{\text{CDi}}$. Control line SWa remains active, so these data are also transferred to the sense lines Si and $\overline{\text{Si}}$ and amplified by the sense amplifiers 16.

As soon as the data for row address $X_1$ have been recalled in this way from the cache, read and write access can begin. Column address $Y_i$ is input, and data DA3 are read onto the read data lines RDB and $\overline{\text{RDB}}$; then data DA4 are written from the write data lines WDB and $\overline{\text{WDB}}$ onto the column data lines CDi and $\overline{\text{CDi}}$ and sense lines Si and $\overline{\text{Si}}$ in the i-th column.

While the data are being recalled from the cache, word line WL0 is deactivated and the bit lines are precharged. The data for row address $X_0$, including the updated data DA2 in the i-th column, thus remain held in both the memory cells 4 of row $X_0$ in the memory cell array 2, and the cache cells $12_{i1}$ of the first cache row $210_1$. Next, control line TG is activated and word line WL1 is activated, to copy the data of row address $X_1$ from the sense lines Si and $\overline{\text{Si}}$ back to the memory cells 4 on word line WL1. This copy-back includes the newly written data DA4.

Access in a cache hit cycle takes place quickly because the data are recalled from the cache via the column data lines CDi and $\overline{\text{CDi}}$, which have a relatively small capacitance to be charged or discharged, instead of via the bit lines BLi and $\overline{\text{BLi}}$, which have a larger capacitance and resistance. Time is also saved by precharging the memory cell array 2 while the cached data are being recalled and read.

(3) Cache Replace Cycle

A cache replace cycle occurs when the input row address does not match the row address held in any tag memory, and there is no empty cache row. One cache row is selected for replacement. The addressed row of data is read from the memory cell array, accessed, and written into the selected cache row. No copy-back is necessary at the start of a cache replace cycle, because the cache contents and memory-cell contents are consistent at the end of the preceding cycle.

The cache row to be replaced can be selected according to various algorithms, such as the well-known least-recently-used (RLU) rule. The present invention is not restricted to any particular replacement algorithm. Here it will be assumed that cache row $210_1$ is replaced.

In FIG. 15, input row address $X_2$ does not match any current tag address, and no empty cache row is available. The first part of this cache replace cycle resembles a cache hit cycle. Control line SWa remains active, but control lines TG and SWc2 are deactivated, leaving the data for the row address $X_1$ in the previous cycle present on the bit lines BLi and $\overline{\text{BLi}}$ and in cache row $210_2$. Next, the sense lines Si and $\overline{\text{Si}}$ and column data lines CDi and $\overline{\text{CDi}}$ are equalized.

Control line SWc1 is now activated, coupling the cache row $210_1$ to be replaced to the column data lines CDi and $\overline{\text{CDi}}$. Equalization of the sense lines Si and $\overline{\text{Si}}$ is continued, and the column data lines CDi and $\overline{\text{CDi}}$ are also equalized, so the existing data in cache row $210_1$ are lost. In the meantime the memory cell array 2 is precharged, leaving the data for row address $X_1$ stored in the memory cells 4 of that row.

When this precharge is completed, control line TG is activated, the word line WL2 designated by the new row address $X_2$ is activated, the sense amplifiers 16 are enabled, and equalization of the sense lines Si and $\overline{\text{Si}}$ and column data lines CDi and $\overline{\text{CDi}}$ is discontinued. The data for row $X_2$ are thereby read onto the bit lines BLi and $\overline{\text{BLi}}$, transferred to the sense lines Si and $\overline{\text{Si}}$, amplified by the sense amplifiers 16, transferred to the column data lines CDi and $\overline{\text{CDi}}$, and loaded into cache row $210_1$.

Read or write access now proceeds as in a cache hit cycle or load cycle. In the drawing, data DA5 are read from the i-th column onto the data bus.

(4) Refresh During Cache Hit Cycle

During a cache hit cycle on one row address, it is possible to refresh a different row in the memory cell array. After the cached data have been recalled onto the column data lines and amplified, the column data lines are disconnected from the sense lines. While read and write access to the column data lines continues, the sense amplifiers can be used to refresh an arbitrary row in the memory cell array. At the end of the cycle, the data on the column data lines are copied back to the addressed row in the memory cell array.

Referring to FIG. 16, input row address $X_1$ matches the address held in tag circuit $29_2$, so a cache hit cycle is initiated. Just as in the cache hit cycle in FIG. 15, control line TG is deactivated and the memory cell array 2 is precharged. Control line SWc1 is also deactivated by the tag circuit 28. As a result, the data (e.g. DA5) left on the column data lines CDi and $\overline{\text{CDi}}$ at the end of the preceding cycle are saved in the memory cells 4 coupled to word line WL2 and the cache cells $12_{i1}$ in cache row 1. Concurrently with these operations, the sense lines Si and $\overline{\text{Si}}$ and column data lines CDi and $\overline{\text{CDi}}$ are equalized; then the control line SWc2 of the cache row $210_2$ that was hit by the new row address $X_1$ is activated by the tag circuit 28, the sense amplifiers 16 are enabled, and data are recalled from cache row $210_2$ onto the column data lines CDi and $\overline{\text{CDi}}$ and sense lines Si and $\overline{\text{Si}}$.

In preparation for refreshing a row in the memory cell array, control line SWa is now deactivated, disconnecting the sense lines Si and $\overline{\text{Si}}$ from the column data lines CDi and $\overline{\text{CDi}}$. Read and write accesses continue to be carried out in the usual way, by input of column addresses, except that in write access, the written data are not amplified by the sense amplifiers. Thus when data DA6 are written in the i-th column, for example, the resulting swing on the column data lines CDi and $\overline{\text{CDi}}$ is less than in FIG. 15. This does not prevent subsequent read access from taking place, because the reduced swing is still adequate to drive the NMOS transistors 221 and 222 and place the new data on the read data lines RDB and $\overline{\text{RDB}}$. After the reading of data DA4 and writing of data DA6, further column addresses are input and read and write continues in the same or other columns.

While this access to the column data lines CDi and $\overline{\text{CDi}}$ is taking place, the sense amplifiers 16 are disabled and the sense lines Si and $\overline{\text{Si}}$ are equalized. Next, after the sense lines Si and $\overline{\text{Si}}$ and bit lines BLi and $\overline{\text{BLi}}$ have both been equalized, control line TG is reactivated, turning on the transfer circuit 8. Simultaneously, a word line to be refreshed is selected by an internal refresh counter and activated. This word line is unrelated to the current input row address $X_1$; in the drawing, word line WL3 is refreshed.

After word line WL3 has been activated, the sense amplifiers 16 are enabled again, and the data in the memory cells 4 coupled to word line WL3 are amplified on the bit lines BLi and $\overline{\text{BLi}}$ and sense lines Si and $\overline{\text{Si}}$. When amplification is complete, control line TG is deactivated to disconnect the bit lines BLi and $\overline{\text{BLi}}$ from the sense lines Si and $\overline{\text{Si}}$, and the memory cell array 2 is precharged, leaving refreshed data in the memory cells 4 coupled to word line WL3.

After control line TG has been deactivated and the transfer circuit 8 has been turned off, the sense amplifiers 16 are disabled and the sense lines Si and $\overline{\text{Si}}$ are equalized. Then control line SWa is activated again, coupling the column data lines CDi and $\overline{\text{CDi}}$ to the sense lines Si and $\overline{\text{Si}}$, and the sense amplifiers are enabled. Data such as DA6 on the column data lines CDi and $\overline{\text{CDi}}$ are now amplified to obtain a full potential swing.

When the memory cell array 2 has been precharged, control line TG is activated again, transferring the amplified data such as DA6 to the bit lines BLi and $\overline{\text{BLi}}$. Then word line WL1 is activated to copy the amplified data back to the memory cells in row $X_1$ in the memory cell array.

If a refresh cycle cannot be scheduled to coincide with a cache hit cycle, then a conventional refresh operation is carried out, and external access is delayed.

The advantages of placing the cache cells in the column switching circuits can be summarized as follows.

First, refresh cycles can be executed within cache hit cycles. Refresh can then be carried out without impairing response speed, and the average data rate can be improved.

Second, precharging of the memory cell array 2 and the recall of data onto the column data lines CDi and $\overline{\text{CDi}}$ can be carried out concurrently, by disconnecting the bit lines from the sense lines. The enables a shortening of the minimum cycle time (the time from input of one row address until input of the next row address can be accepted).

Figure 17:
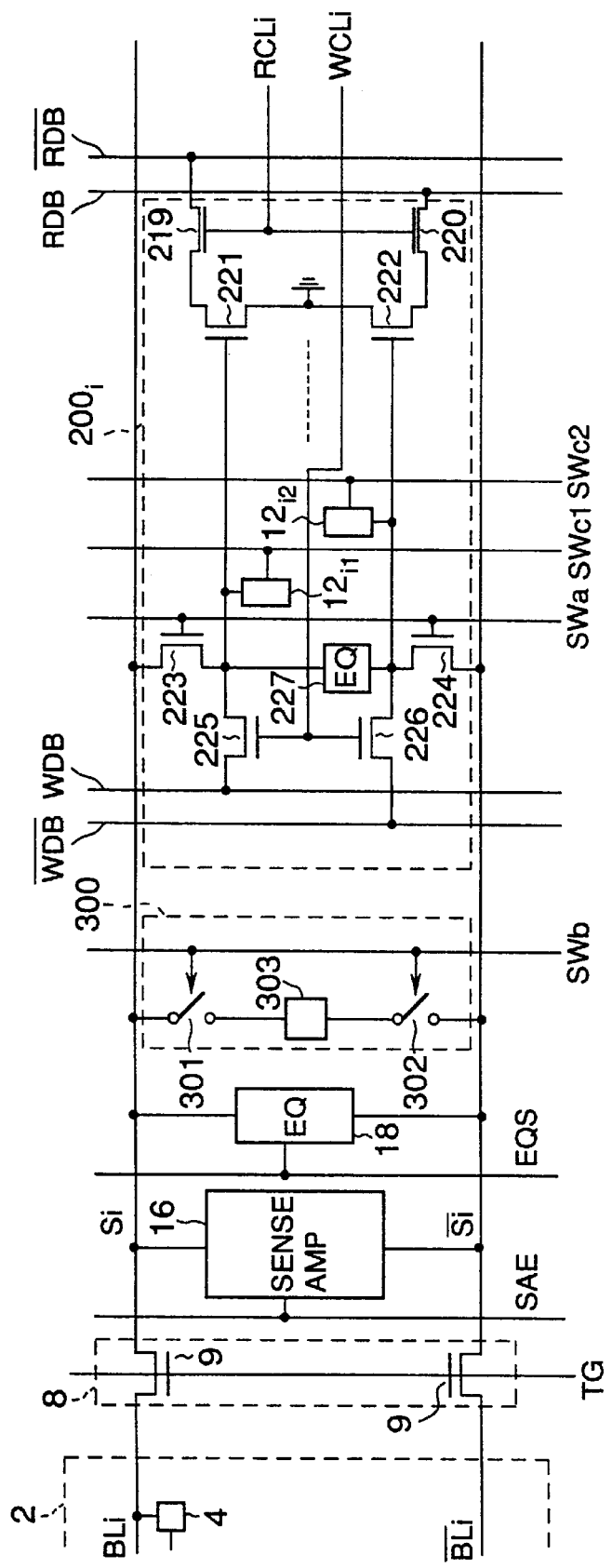
FIG. 17 illustrates a DRAM having write buffers, as well as column switching circuits with internal cache cells.

FIG. 17 is a circuit drawing of part of another novel DRAM. Elements which are the same as elements in FIG. 14 have the same reference numerals.

The only difference between FIGS. 14 and 17 is that in the DRAM in FIG. 17, a write buffer 300 is provided between the sense lines Si and $\overline{\text{Si}}$. The write buffer 300 comprises a switching element 301 such as an NMOS transistor coupled to sense line Si, a switching element 302 such as another NMOS transistor coupled to sense line $\overline{\text{Si}}$, and a storage element 303 such as a capacitor coupled between these switching elements 301 and 302. Switching elements 301 and 302 are controlled by a common control line SWb, which extends in the row direction and controls the write buffers 300 in all columns simultaneously.

The write buffers require only a small amount of additional circuit space, and enable cache access and copy-back can be executed concurrently. Copy-back operations can furthermore be advantageously deferred until made necessary by cache replacement.

Figure 18:
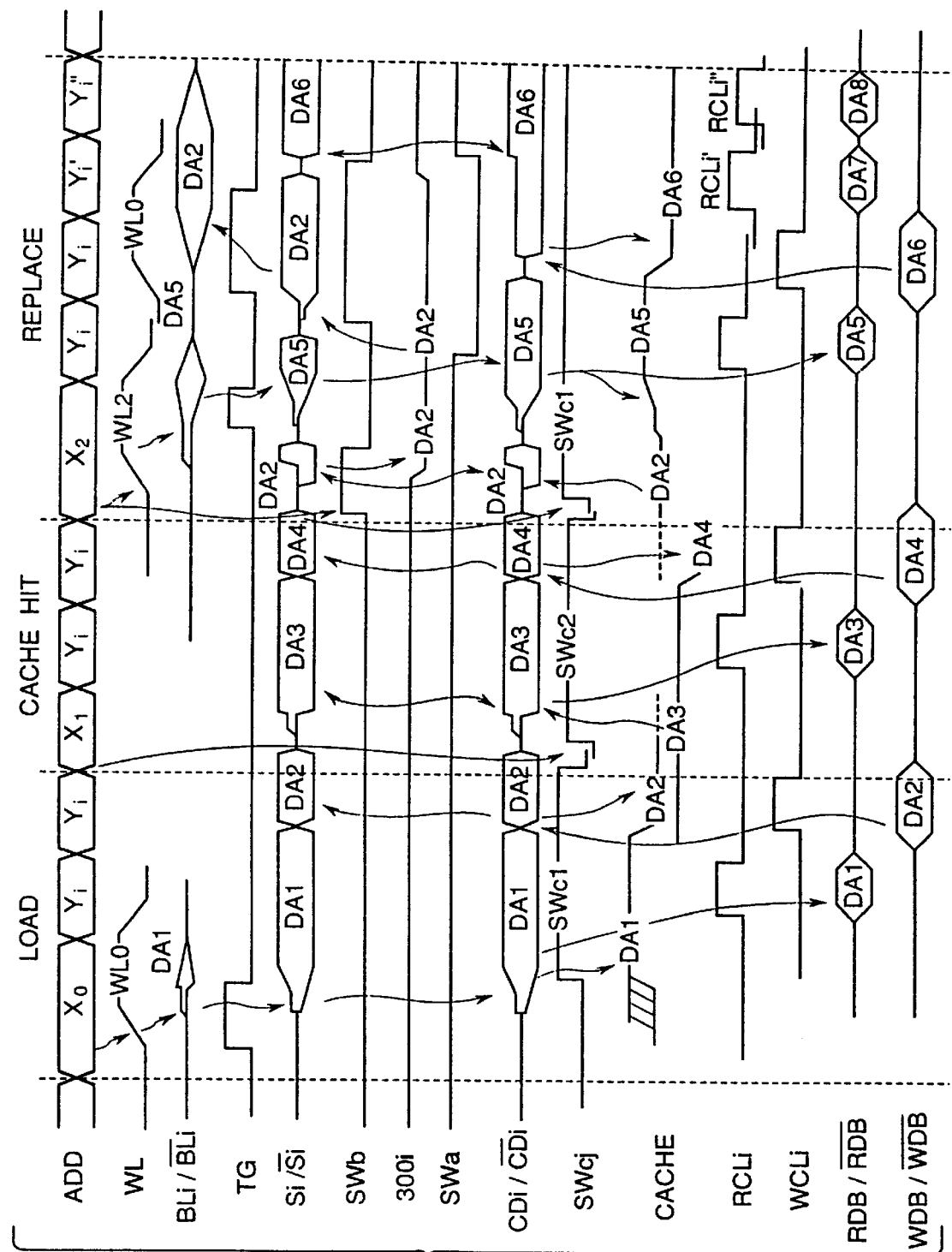
FIG. 18 is a timing diagram illustrating the operation of the DRAM in FIG. 17.
Figure 19:
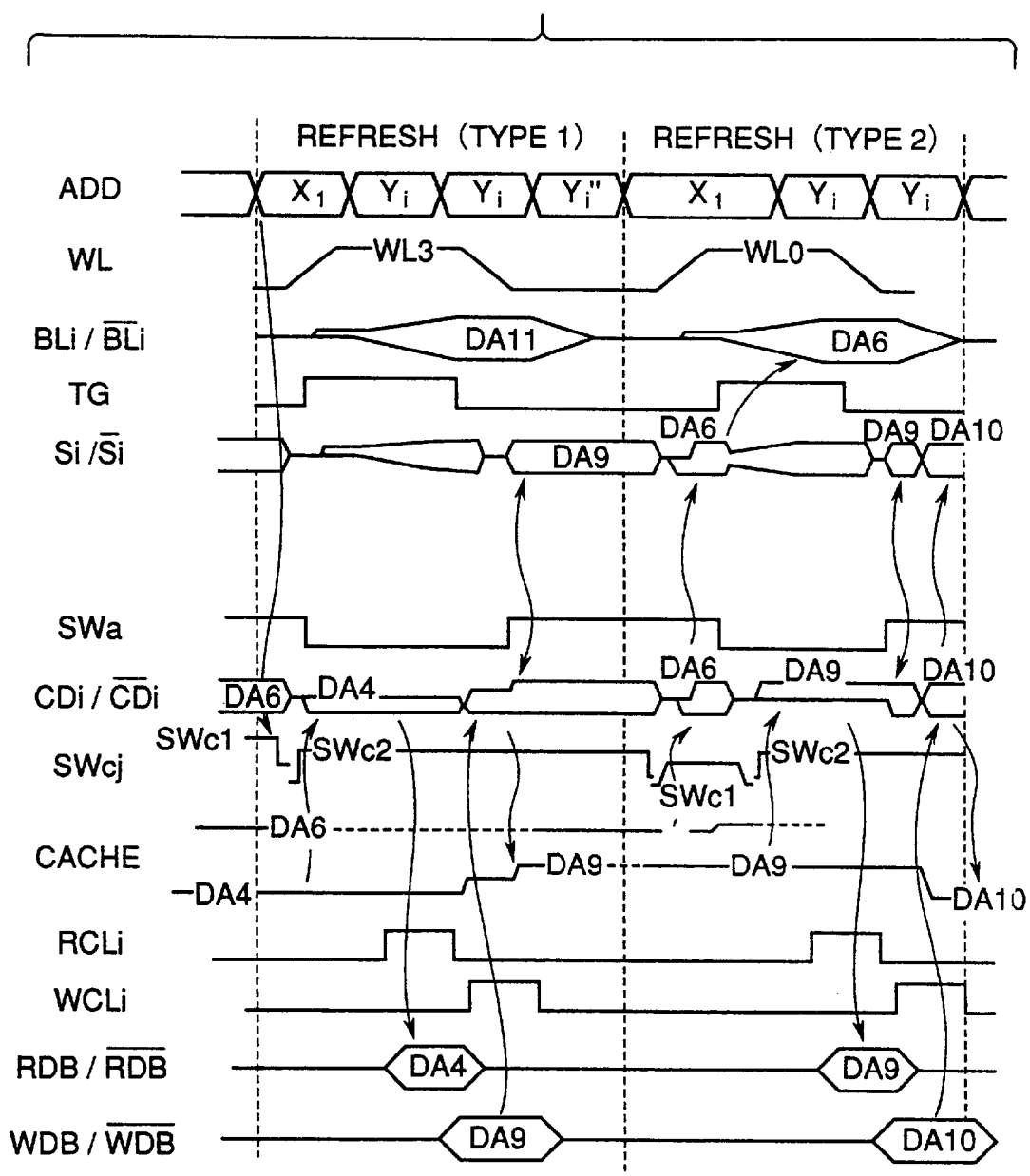
FIG. 19 is a timing diagram illustrating two types of refresh operations in the DRAM of FIG. 17.

FIGS. 18 and 19 illustrate the operation of this DRAM in a cache load cycle, cache hit cycle, cache replace cycle, and combined refresh and cache hit cycle. A feature of these operations is that the cache and memory cell array are allowed to become inconsistent.

(1) Cache Load Cycle

The main difference between the cache load cycle in FIG. 18 and the one in FIG. 15 is that in FIG. 18, control line TG is activated only long enough to transfer the data of row $X_0$ from the bit lines BLi and $\overline{\text{BLi}}$ to the sense lines Si and $\overline{\text{Si}}$. As soon as this transfer is completed, control line TG is deactivated again, disconnecting the bit lines BLi and $\overline{\text{BLi}}$ from the sense lines Si and $\overline{\text{Si}}$, and the memory cell array 2 is precharged.

At the point when control line TG is deactivated and the transfer circuit 8 is turned off, amplification of the signals on the bit lines BLi and $\overline{\text{BLi}}$ and sense lines Si and $\overline{\text{Si}}$ has barely begun, so the potential swing on the bit lines BLi and $\overline{\text{BLi}}$ is still small. Equalization of the bit lines BLi and $\overline{\text{BLi}}$ is accordingly completed in a very short time, with relatively little current dissipation. The current drawn by the sense amplifiers 16 is also greatly reduced, since they do not have to charge and discharge the bit lines BLi and $\overline{\text{BLi}}$.

Control signal SWa is active throughout this cycle, so the data transferred to the sense lines Si and $\overline{\text{Si}}$ are also transferred to the column data lines CDi and $\overline{\text{CDi}}$. At an appropriate point, control line SWc1 is activated to store these data in the empty cache row $210_1$. In addition, column addresses $Y_i$ are input and read and write accesses take place as in FIG. 15. As in FIG. 15, read or write access can begin even before the data have been fully amplified, and write access can be further speeded up because it is not necessary to charge or discharge the bit lines BLi and $\overline{\text{BLi}}$.

In FIG. 18, precharging of the memory cell array 2 is completed even before the end of the first read access (that is, before the read column line RCLi goes low). The memory is accordingly ready to begin a new cycle at this point; a new row address could now be input, so the minimum cycle time is very short.

At the end of the cache load cycle in FIG. 18, the data for row address $X_0$, including the newly written data DA2, are present on the sense lines Si and $\overline{\text{Si}}$ and column data lines CDi and $\overline{\text{CDi}}$, and in cache row $210_1$, but are not held in the memory cell array 2.

(2) Cache Hit Cycle

The cache hit cycle in FIG. 18 is identical to the one in FIG. 15, except that control line TG is inactive, the transfer circuit 8 is in the off state throughout the cycle, and there is no activity in the memory cell array 2. Read and write access are confined completely to the column data lines CDi and $\overline{\text{CDi}}$ and sense lines Si and $\overline{\text{Si}}$. Write access can be speeded up, current dissipation reduced, and the minimum cycle time shortened, because there is no need to charge or discharge any pair of bit lines BLi and $\overline{\text{BLi}}$ or activate or deactivate any word lines.

At the end of the cache hit cycle in FIG. 18, data for row addresses $X_0$ and $X_1$ are held in cache rows $210_1$ and $210_2$, and the corresponding rows in the memory cell array 2 are both invalid.

(3) Cache Replace Cycle

The cache replace cycle in FIG. 18 differs from the one in FIG. 15. In FIG. 18, a cache row is selected for replacement and its data are saved into the write buffers 300. Then the addressed row of data is read out of the memory cell array 2 onto the column data lines CDi and $\overline{\text{CDi}}$ and accessed there. While access to the data on the column data lines is in progress, the replaced data are copied back from the write buffers to the memory cell array.

At the beginning of the cycle, it is recognized that the input row address $X_2$ does not correspond to the row address in any tag memory, and that no cache row is empty, so cache row $210_1$, for example, is selected for replacement. Control line SWc2 is deactivated, the sense amplifiers are disabled, and the column data lines CDi and $\overline{\text{CDi}}$ and sense lines Si and $\overline{\text{Si}}$ are equalized. Control line SWb is activated, so that the write buffers 300 are also equalized.

Next, control line SWc1 is activated. The data (e.g. DA2) that will be replaced are read from cache row $210_1$ onto the column data lines CDi and $\overline{\text{CDi}}$ and sense lines Si and $\overline{\text{Si}}$, amplified by the sense amplifiers, and transferred into the write buffers 300. After a short time, control line SWb is switched off again, leaving the data stored in the write buffers. The sense lines Si and $\overline{\text{Si}}$ and column data lines CDi and $\overline{\text{CDi}}$ are now equalized once again.

While the data of row address $X_0$ are being transferred from cache row $210_1$ into the write buffers 300 in this way, the newly addressed word line WL2 is activated in the memory cell array 2, and the data stored in the memory cells 4 coupled to this word line (the data with row address $X_2$) are transferred onto the bit lines BLi and $\overline{\text{BLi}}$. When the sense lines Si and $\overline{\text{Si}}$ have been equalized, control line TG is activated and the transfer circuit 8 is turned on briefly, transferring the data (e.g. DA5) for row address $X_2$ from the bit lines BLi and $\overline{\text{BLi}}$ to the sense lines Si and $\overline{\text{Si}}$. Then control line TG is deactivated again and the memory cell array 2 is precharged. Since the potential swing on the bit lines BLi and $\overline{\text{BLi}}$ was small, the precharge time is short.

After the deactivation of control line TG, the sense amplifiers 16 continue to amplify the data (DA5) on the sense lines Si and $\overline{\text{Si}}$ and column data lines CDi and $\overline{\text{CDi}}$. When amplification is completed, control line SWa is deactivated, disconnecting the column data lines CDi and $\overline{\text{CDi}}$ from the sense lines Si and $\overline{\text{Si}}$.

Read and write access can now take place using the column data lines CDi and $\overline{\text{CDi}}$ alone. In the drawing, column address $Y_i$ is input, data DA5 are read from the column data lines CDi and $\overline{\text{CDi}}$ in the i-th column onto the read data lines RDB and $\overline{\text{RDB}}$, then data DA6 are written from the write data lines WDB and $\overline{\text{WDB}}$ onto the same pair of column data lines CDi and $\overline{\text{CDi}}$. Next other column addresses $Y_i'$ and $Y_i''$ are input and read access, for example, is carried out in other columns.

While this access is taking place, the sense lines Si and $\overline{\text{Si}}$ are equalized again; then control line SWb is activated and the data DA2 that were stored in the write buffers 300 are transferred onto the sense lines Si and $\overline{\text{Si}}$ and amplified. At the same time, word line WL0 is activated in the memory cell array 2. When amplification is complete, control line TG is activated, the transfer circuit 8 is turned on, and data (e.g. DA2) are transferred from the sense lines Si and $\overline{\text{Si}}$ via the bit lines BLi and $\overline{\text{BLi}}$ to the memory cells 4 at row address $X_0$. When this copy-back is completed, control line TG is deactivated again and the memory cell array 2 is precharged.

After the control line TG is deactivated and transfer circuit 8 is turned off, the sense lines Si and $\overline{\text{Si}}$ are equalized again, then control line SWa is activated to reconnect the sense lines Si and $\overline{\text{Si}}$ to the column data lines CDi and $\overline{\text{CDi}}$. The sense amplifiers 16 now amplify the data on the column data lines CDi and $\overline{\text{CDi}}$, including the newly written data DA6 in the i-th column.

At the end of the cache replace cycle in FIG. 18, data for row addresses $X_1$ and $X_2$ are held in cache rows $210_2$ and $210_1$, respectively, while data for row address $X_0$ are held in the memory cell array 2. The data for row address $X_2$ also remain amplified and available on the sense lines Si and $\overline{\text{Si}}$ and column data lines CDi and $\overline{\text{CDi}}$, ready for immediate access if the same row address $X_2$ is input again.

Compared with FIG. 15, the cache replace cycle in FIG. 18 enables a quicker transfer of the required data from the memory cell array to the sense lines, because the newly addressed word line (WL2) can be activated at the beginning of the cycle, without waiting for the memory cell array to be precharged.

(4) Refresh Cycle During a Cache hit cycle

Since there is no interchange of data between the cache and memory cell array in a cache hit cycle, refreshing the memory cell array during a cache hit cycle is a simple matter. After the required data have been recalled, the sense lines are disconnected from the column data lines and coupled to the bit lines, and the sense amplifiers are used to refresh an arbitrary row of memory cells.

Referring to FIG. 19, this cycle is shown as a type-1 refresh cycle. When row address $X_1$ is input, a hit is recognized on cache row $210_2$, so control line SWc1 is deactivated (storing data DA6 in cache row $210_1$), and the sense lines Si and $\overline{\text{Si}}$ and column data lines CDi and $\overline{\text{CDi}}$ are equalized. Then control line SWc2 is activated, recalling the data for row address $X_1$ (e.g. DA4) onto the column data lines CDi and $\overline{\text{CDi}}$. Control line SWa, however, is deactivated, so the recalled data are not amplified. The unamplified signals are still adequate for read access, so when column address $Y_i$ is input, data DA4 are read from the i-th column onto the read data lines RDB and $\overline{\text{RDB}}$. This is followed by a write access that replaces data DA4 with data DA9, then a further access to a different column $Y_i''$.

Meanwhile, when the cache hit was first recognized, a refresh address was generated and the corresponding word line (e.g. WL3) was activated in the memory cell array 2. After control line SWa is deactivated to disconnect the sense lines Si and $\overline{\text{Si}}$ from the column data lines CDi and $\overline{\text{CDi}}$, the sense lines Si and $\overline{\text{Si}}$ and sense amplifiers 16 are equalized, then control line TG is activated to turn on the transfer circuit 8, coupling the sense lines Si and $\overline{\text{Si}}$ to the bit lines BLi and $\overline{\text{BLi}}$, so that the sense amplifiers can amplify and refresh the data (e.g. DA11) in the memory cells 4 coupled to word line WL3. When the amplification is complete, control line TG is deactivated and the memory cell array 2 is precharged, leaving refreshed data in these memory cells 4.

After control line TG is deactivated, the sense lines Si and $\overline{\text{Si}}$ are equalized again, then control line SWa is activated to recouple the sense lines Si and $\overline{\text{Si}}$ to the column data lines CDi and $\overline{\text{CDi}}$. This enables the sense amplifiers to amplify the data DA9 on the column data lines CDi and $\overline{\text{CDi}}$, and the subsequently written data DA10.

Compared with the refresh cycle in FIG. 16, the one in FIG. 19 is finished earlier, because word line WL3 can be activated at the beginning of the cache hit cycle, without waiting for the memory cell array 2 to be precharged.

From FIGS. 18 and 19, the write buffers 300 can be seen to provide the following advantages.

First, every cycle begins with the memory cell array already precharged. Accordingly, when the memory cell array must be accessed to read or refresh data, the required word line can be activated immediately. Access times and cycle times can accordingly be shortened.

Second, the cycle time in a cache hit can be further shortened, and operating current reduced, by leaving the memory cell array 2 disconnected throughout the cycle. No word lines need be activated, and no precharging need be carried out.

Third, when data are transferred from the memory cell array 2 to the sense lines, cycle times can be shortened and power dissipation greatly reduced by turning off the transfer circuit 8 before amplification of the data is completed, so that the potential swing on the bit lines BLi and $\overline{\text{BLi}}$ remains small.

Figure 20:
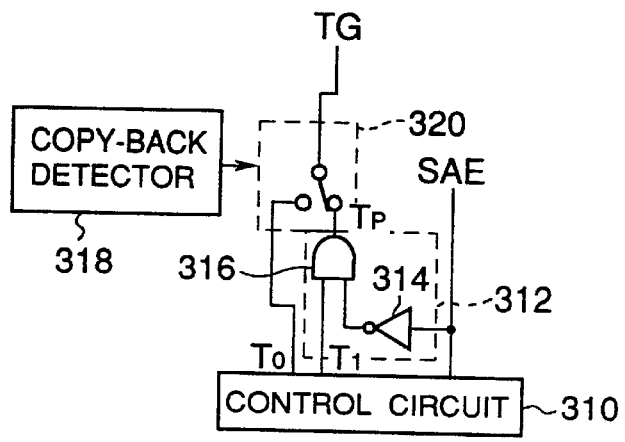
FIG. 20 illustrates a circuit for controlling the coupling of bit lines to sense lines.

FIG. 20 is a circuit diagram showing a transfer control circuit for controlling the transfer circuit 8.

In this transfer control circuit, a control circuit 310 receives, among other input signals, the sense amplifier enable signal SAE, and generates two control signals $T_0$ and $T_1$. Signal $T_0$ controls the transfer circuit 8 in operations in which data must be transferred from the sense lines to the bit lines; these operations include copy-back and refresh. Signal $T_1$ controls the transfer circuit 8 in operations in which data are transferred unidirectionally from the bit lines to the sense lines; that is, operations in which it is not necessary to transfer amplified data back to the bit lines. In the present DRAM, these can be characterized as operations in which data are transferred from the memory cell array 2 to the cache.

A logic circuit 312 combines SAE with $T_1$ to generate a signal $T_2$ that is active when $T_1$ is active and SAE is inactive, and is inactive at other times. In FIG. 20 this logic circuit 312 comprises an inverter 314 that inverts SAE, and an AND gate 316 that takes the logical AND of $T_1$ and the output of the inverter 314.

A copy-back detector 318 detects copy-back and refresh operations and controls a switch 320 that outputs the TG signal that controls the transfer circuit 8. One input to the switch 320 is $T_0$. The other input is the output $T_2$ of the logic circuit 312; that is, the output of the AND gate 316.

When the copy-back detector 318 does not detect a copy-back or refresh operation, it sets the switch 320 as shown in the drawing. Accordingly, after signals $T_1$, $T_2$, and TG are activated to turn on the transfer circuit 8, as soon as SAE goes high and the sense amplifiers are enabled, $T_2$ and TG are deactivated again by the inverted SAE signal, thereby minimizing amplification of the potential difference on the bit lines.

When the copy-back detector 318 detects either a copy-back or a refresh, it sets the switch 320 to the opposite position, so that TG is identical to $T_0$, and is not deactivated when the sense amplifiers are enabled.

Figure 21:
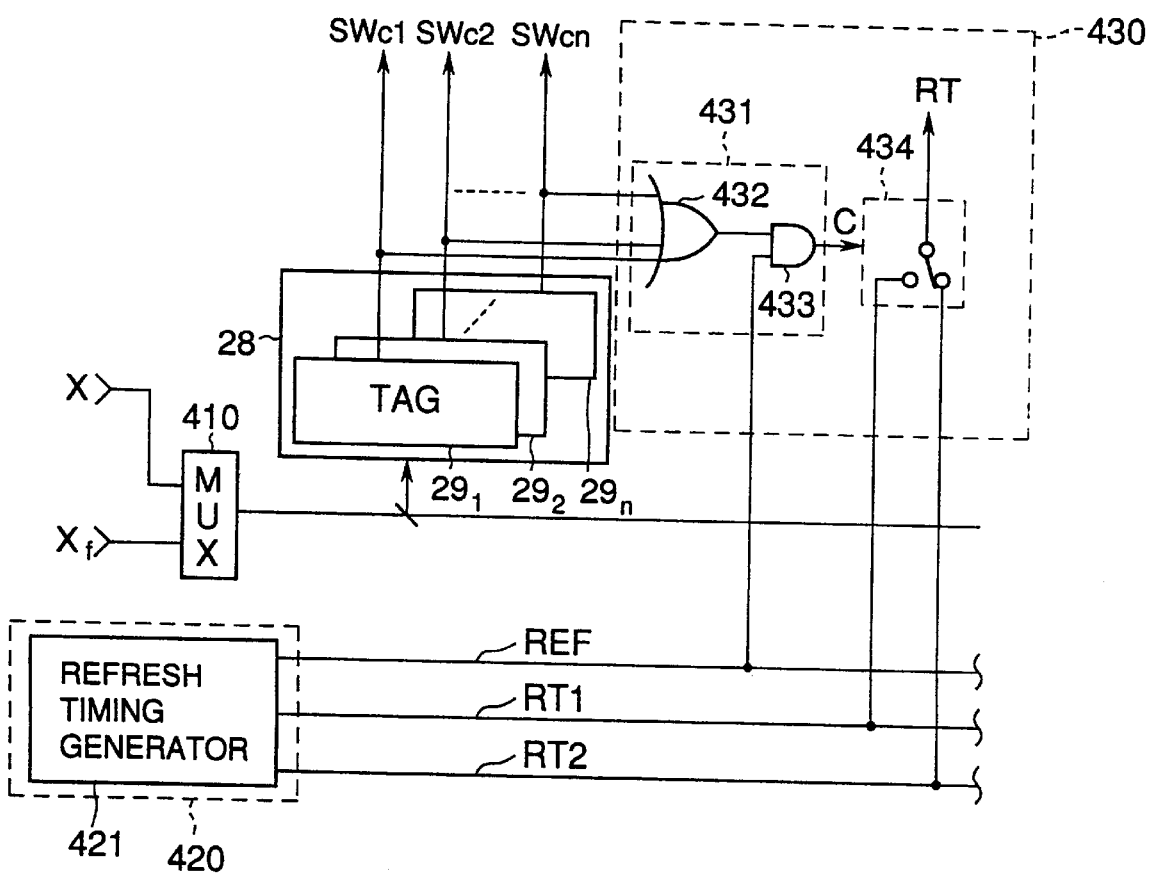
FIG. 21 illustrates a refresh control circuit.

FIG. 21 illustrates a refresh control circuit that can be used in the DRAM in FIG. 17. The purpose of this circuit is to combine refresh and copy-back operations.

In this refresh control circuit, a multiplexer 410 selects either a row address X indicating data to be accessed or a refresh address $X_f$ indicating data to be refreshed, and supplies the selected address to the tag circuit 28.

Part of this refresh control circuit is disposed in the DRAM's central control circuit 420, which comprises logic circuits and various timing generators that direct operations of the entire DRAM. One of these timing generators is a refresh timing generator 421 that generates a refresh signal REF and two different sets of refresh timing signals RT1 and RT2. Refresh timing signals RT1 are adapted to control the type-1 refresh cycle shown in FIG. 19. Refresh timing signals RT2 are adapted for a type-2 refresh cycle, which will be described below.

The signals REF, RT1, and RT2 are supplied to a refresh selection circuit 430, which also receives the cache control signals SWcj (j=1, . . . , n) from the tag circuit 28. The refresh signal REF and cache control signals SWcj are supplied to a logic circuit 431 comprising an n-input OR gate 432 that receives the cache control signals SWcj, and a two-input AND gate 433 that receives REF and the output of the OR gate 432. The output signal C of the AND gate 433 controls a switch 434 that selects either RT1 or RT2 for supply to circuits (not shown) that direct execution of the type-1 and type-2 refresh cycles.

FIG. 21 is somewhat simplified; for example, it does not show additional circuits for distinguishing between a type-1 refresh that coincides with a cache hit cycle and a refresh cycle that does not coincide with a cache hit.

Next, the operation of the refresh control circuit will be described.

When a refresh address $X_f$ is generated, it is fed through the multiplexer 410 to the tag circuit 28. At the same time, the refresh timing generator 421 begins generating both sets of refresh timing signals RT1 and RT2 and activates the refresh signal REF.

If the refresh address $X_f$ does not match the row address held in any tag memory, the outputs of the OR and AND gates 432 and 433 in the logic circuit 431 are both low, the switch 432 selects refresh timing signals RT1, and a type-1 refresh operation is carried out as already described. If the refresh address $X_f$ matches the address in one of the tag circuits, however, the outputs of the OR and AND gates 432 and 433 in the logic circuit are both high, the switch 432 selects the second set of refresh timing signals RT2, and a type-2 refresh is carried out as described below. Here it will be assumed that the refresh address $X_f$ matches row address $X_0$, which is held in the tag memory $29_1$ for cache row $210_1$.

Referring again to FIG. 19, in a type-2 refresh operation, the word line WL0 of the memory cells to be refreshed is activated, and the data DA6 held in the corresponding cache row $210_1$ are transferred to the sense lines Si and $\overline{\text{Si}}$ and amplified by the sense amplifiers 16. This incidentally refreshes the cache row $210_1$. After amplification is complete, control line TG is activated and the transfer circuit 8 is turned on, transferring the data DA6 to the bit lines BLi and $\overline{\text{BLi}}$. That is, a copy-back is performed.

The type-2 refresh in FIG. 19 coincides with a cache hit cycle on row address $X_1$, corresponding to cache row $210_2$. Accordingly, after data DA6 have been transferred from the internal column data lines CDi and $\overline{\text{CDi}}$ to the sense lines Si and $\overline{\text{Si}}$, control signal SWa is deactivated to disconnect the column data lines CDi and $\overline{\text{CDi}}$ from the sense lines Si and $\overline{\text{Si}}$, cache control line SWc1 is deactivated, the column data lines CDi and $\overline{\text{CDi}}$ are equalized, then cache control line SWc2 is activated, and data DA9 in cache row $210_2$ are placed on the column data lines CDi and $\overline{\text{CDi}}$.

Subsequent operations in a type-2 refresh are similar to a type-1 refresh. Read and write accesses can be carried out on the data on the column data lines CDi and $\overline{\text{CD}}$i; in FIG. 19, data DA9 are read from the i-th column, then data DA10 are written in the i-th column. At the end of the cycle, control line TG is deactivated, the transfer circuit 8 is turned off, the memory cell array 2 is precharged, control line SWa is activated again, and the sense amplifiers 16 are used to amplify the data on the column data lines CDi and $\overline{\text{CD}}$i.

Use of the type-2 refresh cycle has the following advantage. Since data stored in the cache cells $12_{ij}$ are not kept up to date in the memory cell array 2, the cache cells $12_{ij}$ must be refreshed to prevent data loss. The refresh control circuit in FIG. 21 assures that this will take place. When a refresh address $X_f$ is generated, if the corresponding row of data is not currently stored in the cache, the memory cells 4 are refreshed, e.g. by a type-1 refresh. If the corresponding row of data is currently stored in the cache, a type-2 refresh is carried out, the cache cells are refreshed, and the data are also copied back to the memory cell array.

As a result, the cache cells do not have to be designed to tolerate longer intervals between refreshes than do the memory cells. Nor is it necessary to increase the refresh rate to provide additional refreshes for the cache cells.

A further advantage occurs if the DRAM remains in standby mode for an extended time. Refreshing continues in standby under control of the central control circuit 420, with type-2 refreshes being carried out on data stored in the cache. After all row addresses have been refreshed, all data in the cache cells will have been copied back to the memory cells. At this point further refreshing of the cache cells is unnecessary. The tag circuit 28 can now be reset by flagging all cache rows as empty, and current can be conserved by deactivating control line SWa, so that the column data lines CDi and $\overline{\text{CD}}$i do not have to be charged and discharged.

To reduce standby current dissipation, the memory cells 4 are preferably designed to tolerate a relatively slow refresh rate in the standby state. Another advantage of the refresh control circuit of FIG. 21 is that the cache cells do not have to be designed for this slow refresh rate. Refresh cycles can be executed at a faster rate while the DRAM is active, and until all row addresses have been refreshed once in standby; then the refresh rate can be reduced. The cache design can thus be simplified: for example, instead of setting the NMOS transistor substrate well potential to a negative value, it can be set at ground level (Vss), and the substrate well can be shared with the sense amplifiers 16 and other elements, thereby reducing dimensions.

In addition, the size of the switching transistors in the cache cells can be reduced, so less power is required to drive them. Significant power can be saved in this way, because to enable a Vcc potential to be stored in the cache cells, the cache control lines SWc1–SWcn are driven at an active level higher than Vcc.

To enable a Vcc potential to be stored in the memory cells, the word lines and transfer gate lines (e.g. TG) must also be driven at an active level higher than Vcc. With the scheme illustrated in FIGS. 17 to 19, however, when data are transferred from the memory cell array to the cache, it is not necessary to drive the word lines and transfer gate line TG at this higher level, because the transfer circuit 8 is turned off before amplification of the data is completed. Power can accordingly be saved by providing three-level drivers for the word lines and TG.

Figure 22:
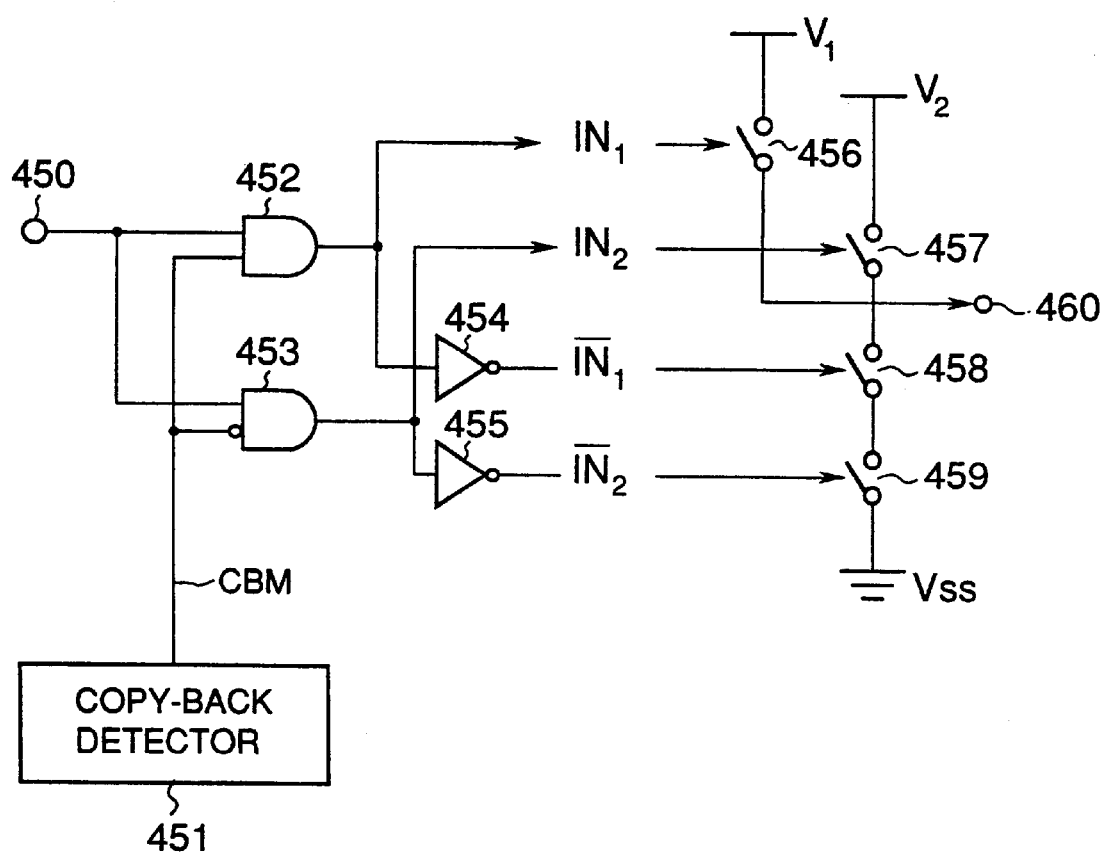
FIG. 22 illustrates a three-level driver circuit.

FIG. 22 illustrates one example of a three-level driver circuit that can be used for driving the word lines and TG in the DRAM of FIG. 17.

This driver circuit has an input terminal 450 that inputs, for example, a decoded row address signal to activate a word line, or a control signal to activate the TG control line. A copy-back detector 451 outputs a copy-back mode signal CBM that is active (high) when a copy-back or refresh is performed. The input signal from input terminal 450 and the CBM signal are combined by AND gates 452 and 453 and inverters 454 and 455 to control switches 456, 457, 458, and 459. Switch 456 is coupled to a source of a first (boosted) potential $V_1$ such as Vcc+$V_{tn}$. Switch 456 is coupled to a source of a second potential $V_2$ such as Vcc. Both switches 456 and 457 are coupled to an output terminal 460, which is connected to a word line or to control line TG. Switches 458 and 459 are coupled in series between the output terminal 460 and ground (Vss).

This driver circuit operates as follows.

When the copy-back detector 451 detects a copy-back or refresh operation, it activates the CBM signal, so that the output of AND gate 452 is high or low according to the level of input terminal 450, while the output of AND gate 453 is low. Accordingly, signal $\overline{\text{IN}}_2$ in FIG. 22 is low while $\overline{\text{IN}}_2$ is high, and switch 457 is off while switch 459 is on. If the input terminal 450 is high, signal $\text{IN}_1$ will be high and $\overline{\text{IN}}_1$ will be low, switch 456 will be on and switch 458 will be off, and potential $V_1$ will be coupled to the output terminal 460. If the input terminal 450 is low, signal $\text{IN}_1$ will be low and $\overline{\text{IN}}_1$ will be high, switch 456 will be off and switch 458 will be on, and the output terminal 460 will be coupled to ground.

When the copy-back detector 451 does not detect a copy-back or refresh, CBM is deactivated (low), making the output of AND gate 452 low while the output of AND gate 453 depends on the logic level of the input terminal 450. Operations analogous to the above cause the output terminal 460 to go to $V_2$ when the input level is high, and to ground when the input level is low.

If this driver is used, then the word lines and TG line will be driven at a level $V_1$ higher than Vcc only when a copy-back or refresh is carried out. At other times they will be driven at the lower $V_2$ level, thereby conserving power.

Figure 23:
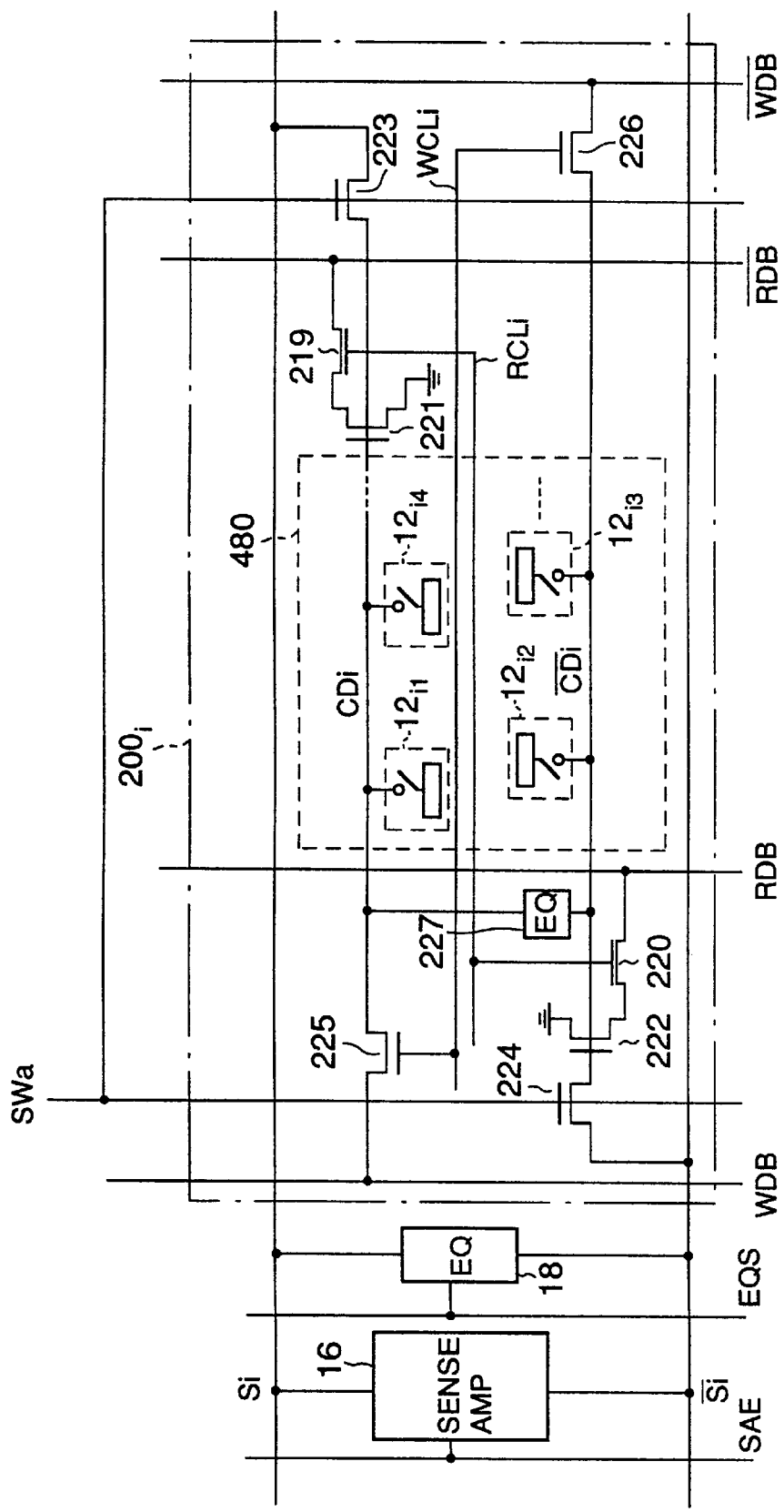
FIG. 23 illustrates a preferred layout of the column switching circuits in the DRAM of FIG. 14 or 17.

FIG. 23 shows one preferred arrangement of cache cells, switching elements, and signal lines in the column switching circuit $200_i$ of FIG. 14 or 17.

In this column switching circuit $200_i$, cache cells $12_{i1}$–$12_{i4}$ are formed in a cache element area 480. To the right of this area 480 are to be found read data line $\overline{\text{RDB}}$, write data line $\overline{\text{WDB}}$, and the NMOS transistors 219, 221, 223, and 226 by which the column data lines CDi and $\overline{\text{CD}}$i are interfaced to these data lines $\overline{\text{RDB}}$ and $\overline{\text{WDB}}$ and sense line Si. To the left of this area 480 are to be found read data line RDB, write data line WDB, and the NMOS transistors 220, 222, 224, and 225 by which the column data lines CDi and $\overline{\text{CD}}$i are interfaced to RDB, WDB, and sense line $\overline{\text{S}}$i. The write column line RCLi and read column line WCLi extend across the area 480, being routed between the column data lines CDi and $\overline{\text{CD}}$i.

This arrangement is symmetrical and permits a dense layout of signal lines and circuit elements, regardless of the dimensions of the circuit elements. It is suitable for high levels of integration.

Figure 24:
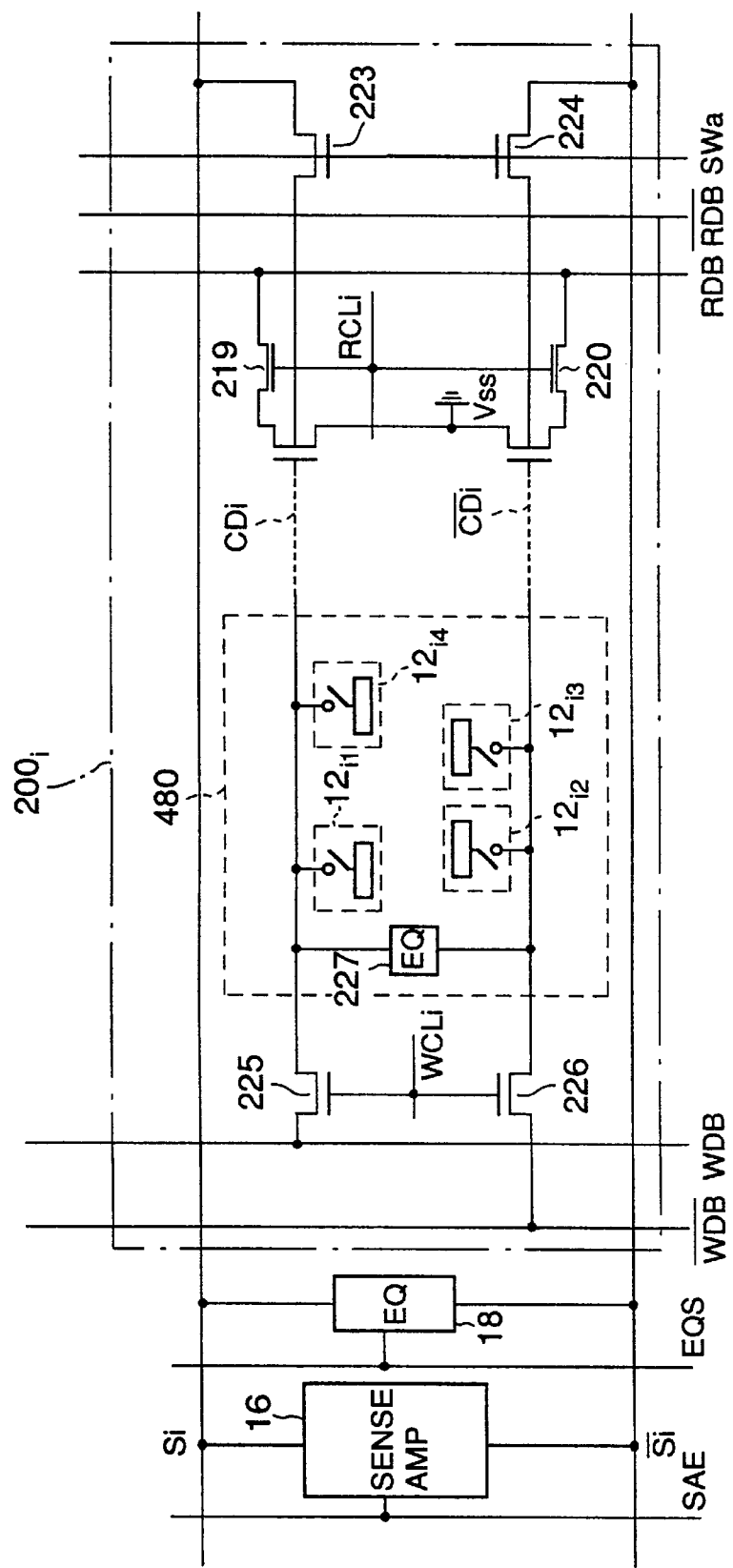
FIG. 24 illustrates another preferred layout of the column switching circuits in the DRAM of FIG. 14 or 17.

FIG. 24 shows another preferred layout. Write data lines WDB and $\overline{\text{WDB}}$ are now disposed to the left of the cache element area 480, together with the transistors 225 and 226 that couple them to the column data lines CDi and $\overline{\text{CD}}$i. Read data lines RDB and $\overline{\text{RDB}}$ are disposed to the right of the cache element area 480, together with the transistors 219, 220, 221, and 222 that couple them to the column data lines CDi and $\overline{\text{CD}}$i, and transistors 223 and 224 that couple the column data lines CDi and $\overline{\text{CD}}$i to the sense lines Si and $\overline{\text{S}}$i.

This layout is also suited for high integration. It furthermore prevents interference between the read and write data lines, and by placing complementary bus lines side-by-side, provides good noise immunity.

Figure 25:
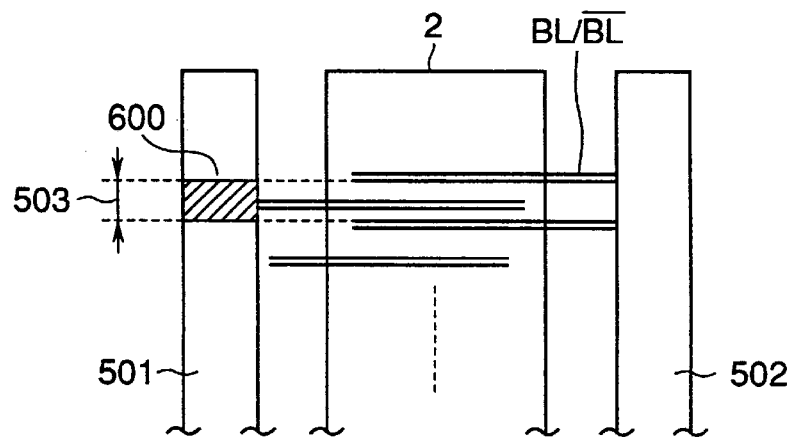
FIG. 25 illustrates a DRAM with rows of sense amplifiers disposed on both sides of a memory cell array.

FIG. 25 shows a layout in which one row 501 of sense amplifiers and column switching circuits is disposed on the left of the memory cell array 2, and another similar row 502 is disposed on the right of the same the memory cell array 2. Pairs of complementary bit lines are coupled alternately to the left row 501 and right row 502. The circuit area 600 occupied by one sense amplifier and one column switching circuit accordingly corresponds to a span 503 of four bit lines, as indicated.

Figure 26:
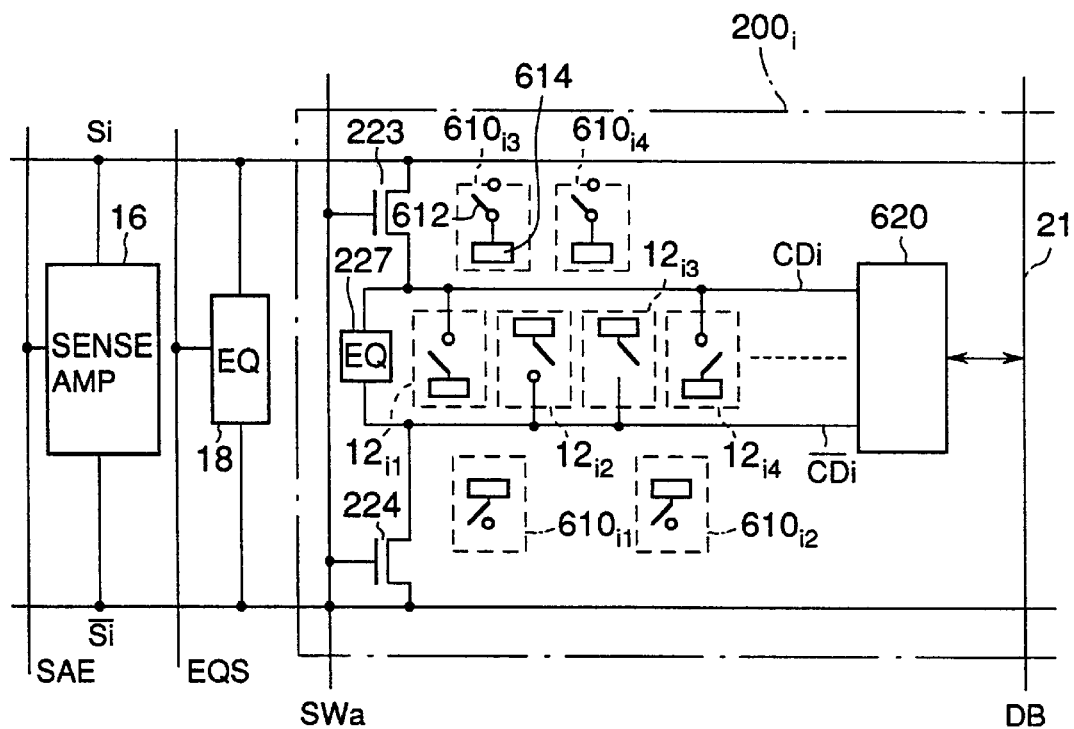
FIG. 26 illustrates a preferred layout of the column switching circuits in the DRAM of FIG. 25.

FIG. 26 shows this circuit area 600 in detail. As in FIGS. 23 and 24, cache cells $12_{i1}$–$12_{i4}$ are disposed between column data lines CDi and $\overline{\text{CDi}}$, which are disposed between sense lines Si and $\overline{\text{Si}}$. In addition, dummy cells $610_{i1}$–$610_{i4}$ are disposed in the cache element area 480 between the column data lines CDi and $\overline{\text{CDi}}$ and sense lines Si and $\overline{\text{Si}}$.

Each of the cache cells $12_{i1}$–$12_{i4}$ comprises a switching element and a storage element, as in FIG. 2 for example, the switching element coupling the storage element to one of the column data lines CDi or $\overline{\text{CDi}}$. The dummy cells $610_{i1}$–$610_{i4}$ comprise similar switching elements 612 and storage elements 614, with the same dimensions and shapes as the corresponding elements in the cache cells $12_{i1}$–$12_{i4}$, but the switching elements 612 are coupled only to the storage elements 614, and are not electrically coupled to the column data lines CDi and $\overline{\text{CDi}}$ or sense lines Si and $\overline{\text{Si}}$.

For example, if the switching elements 612 in the dummy cells $610_{i1}$–$610_{i4}$ are NMOS transistors, their drains may be coupled to the storage elements 614, and their sources to the sources of the NMOS-transistor switching elements 612 in the adjacent dummy cells, with no contact holes for coupling the source lines to anything else. Except for this lack of contact holes for the dummy cells $610_{i1}$–$610_{i4}$, the structure and pitch of the cache cells $12_{i1}$–$12_{i4}$ and dummy cells $610_{i1}$–$610_{i4}$ closely mimics the structure and pitch of the memory cells in the memory cell array 2. It therefore becomes easy to set fine-pattern fabrication conditions, and production yields can be improved.

FIGS. 23, 24, and 26 show only four cache cells $12_{i1}$–$12_{i4}$ and dummy cells $610_{i1}$–$610_{i4}$, but of course this is not a restriction; there may be an arbitrary number of each. To simplify FIG. 26, the data bus 21 is indicated by a single line DB, and the transistors that interface the data bus 21 to the column data lines are shown collected into a single block 620, but this should be understood as representing the arrangement in FIG. 23 or 24, or another suitable arrangement.

The present invention is not restricted to the above embodiments. For example, the NAND gates in FIGS. 1 and 5 may be replaced by circuits, similar to the one in FIG. 21, that refresh the cache when the corresponding rows of memory cells are refreshed. The circuit configurations in FIGS. 11, 20, 21, and 22 may be altered in various ways, signal polarities may be reversed, and other modifications which will be apparent to those skilled in the art can be made without departing from the scope of the invention as claimed below. Moreover, many aspects of the invention apply not only to DRAM devices but to other monolithic semiconductor memory devices that can usefully employ a built-in cache.

What is claimed is:

1. In a semiconductor memory device having word lines, bit lines, memory cells coupled to said word lines and bit lines, sense lines, sense amplifiers coupled to said sense lines, write buffers coupled to said sense lines, column data lines coupled to said sense lines, cache cells coupled to said column data lines, and a data bus, a method of executing a cache hit cycle, comprising the steps of:

receiving a row address corresponding to data stored in said cache cells;

transferring data from said cache cells via said column data lines to said sense lines;

amplifying the data on said sense lines and said column data lines; and receiving at least one column address and transferring data between said column data lines and said data bus, thereby completing said cache hit cycle.

2. The method of claim 1, wherein said sense amplifiers are left enabled when said cache hit cycle ends.

3. The method of claim 1, wherein said bit lines are left disconnected from said sense lines throughout said cache hit cycle, and data are not transferred to said memory cells.

4. The method of claim 1, wherein the step of transferring data from said cache cells to said sense lines comprises the further steps of:

disabling said sense amplifiers;

interconnecting pairs of said sense lines;

waiting a certain time, thus allowing charge on said sense lines to discharge into said sense amplifiers; then
   supplying a fixed potential to said sense lines but not to said sense amplifiers.

* * * * *